(12) United States Patent
Ueta

(10) Patent No.: US 12,550,523 B2
(45) Date of Patent: Feb. 10, 2026

(54) METHOD FOR MANUFACTURING DISPLAY DEVICE, AND DISPLAY DEVICE

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 394 days.

(21) Appl. No.: 18/025,095

(22) PCT Filed: Sep. 10, 2020

(86) PCT No.: PCT/JP2020/034280
§ 371 (c)(1),
(2) Date: Mar. 7, 2023

(87) PCT Pub. No.: WO2022/054198
PCT Pub. Date: Mar. 17, 2022

(65) Prior Publication Data
US 2023/0329078 A1 Oct. 12, 2023

(51) Int. Cl.
*H10K 50/115* (2023.01)
*H10K 59/12* (2023.01)
*H10K 71/20* (2023.01)

(52) U.S. Cl.
CPC ....... *H10K 50/115* (2023.02); *H10K 59/1201* (2023.02); *H10K 71/211* (2023.02)

(58) Field of Classification Search
CPC . H10K 50/115; H10K 59/1201; H10K 71/211
See application file for complete search history.

(56) References Cited

U.S. PATENT DOCUMENTS

| | | | |
|---|---|---|---|
| 2009/0087792 A1 | 4/2009 | Izumi et al. | |
| 2013/0069036 A1* | 3/2013 | Miyata | C09K 11/025 438/35 |
| 2017/0136490 A1 | 5/2017 | Sanchot et al. | |

FOREIGN PATENT DOCUMENTS

| | | |
|---|---|---|
| JP | 2009087760 A | 4/2009 |
| JP | 2017097348 A | 6/2017 |
| WO | 2011148791 A1 | 12/2011 |

* cited by examiner

*Primary Examiner* — Daniel P Shook
(74) *Attorney, Agent, or Firm* — ScienBiziP, P.C.

(57) ABSTRACT

A method for manufacturing a display device includes forming a first layer including first quantum dots in each of a first region and a second region, the first region and the second region each being a region in which a light-emitting device is formed, making the first layer in the second region non-light-emitting, forming a second layer including second quantum dots in each of the first region and the second region, and making the second layer in the first region non-light-emitting.

2 Claims, 21 Drawing Sheets

METHOD FOR MANUFACTURING DISPLAY DEVICE, AND DISPLAY DEVICE

TECHNICAL FIELD

The disclosure relates to a method for manufacturing a display device, and a display device.

BACKGROUND ART

PTL 1 discloses a method for manufacturing an electroluminescence element in which a first color light-emitting layer, a second color light-emitting layer, and a third color light-emitting layer each containing quantum dots are patterned in order using a photolithography method.

CITATION LIST

Patent Literature

PTL 1: JP 2009-87760 A

SUMMARY OF INVENTION

Technical Problem

In a case where light-emitting layers that include quantum dots and emit light of a plurality of colors are patterned into pixels for each emission color, it is difficult to control the patterning process, and light emission unevenness or color mixing is likely to occur. An aspect of the disclosure provides a method for manufacturing a display device in which occurrence of light emission unevenness and color mixing are suppressed, and the display device.

Solution to Problem

A method for manufacturing a display device according to an aspect of the disclosure includes forming a first layer including first quantum dots in each of a first region and a second region, the first region and the second region each being a region in which a light-emitting device is formed, making the first layer in the second region non-light-emitting, forming a second layer including second quantum dots in each of the first region and the second region, and making the second layer in the first region non-light-emitting.

A display device according to an aspect of the disclosure includes a first light-emitting device and a second light-emitting device, in which each of the first light-emitting device and the second light-emitting device includes a first layer including first quantum dots and a second layer layered on the first layer and including second quantum dots, the first layer in the second light-emitting device is non-light-emitting, and the second layer in the first light-emitting device is non-light-emitting.

BRIEF DESCRIPTION OF DRAWINGS

FIG. 10 is a diagram showing patterns of combinations of the first layer, the second layer, and the third layer forming each light-emitting layer, and degrees of carrier injection efficiency and light absorption in a case where the light-emitting device has a direct structure.

FIG. 11 is a diagram showing variations of the first layer, the second layer, and the third layer forming each light-emitting layer, and degrees of carrier injection efficiency and light absorption in a case where the light-emitting device has an inverted structure.

DESCRIPTION OF EMBODIMENTS

Embodiments

Figure 1:
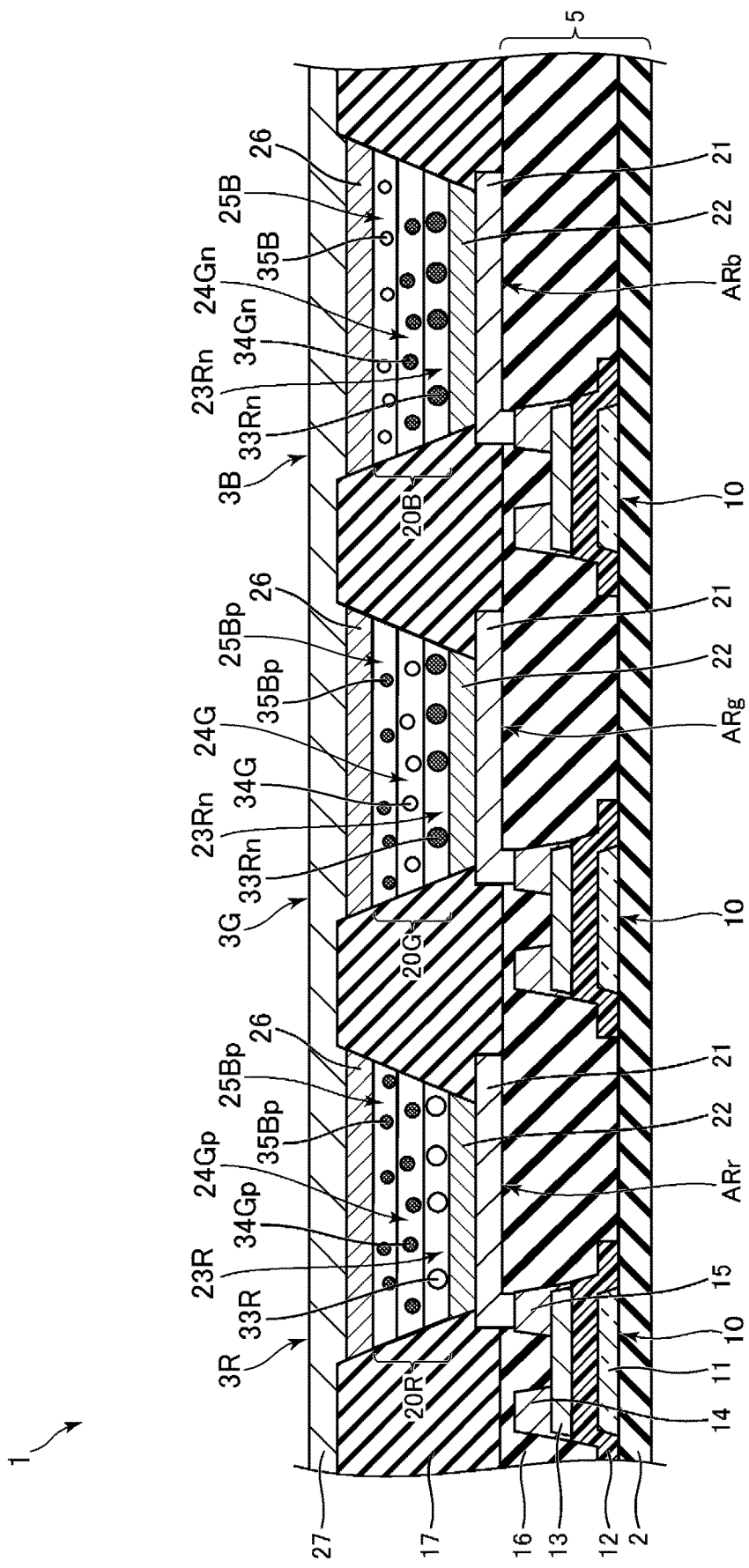
FIG. 1 is a cross-sectional view illustrating a schematic configuration of a display device according to an embodiment.

FIG. 1 is a cross-sectional view illustrating a schematic configuration of a display device 1 according to an embodiment. The display device 1 can be used for various displays such as a display used in a television or a smartphone, for example.

The display device 1 includes, for example, a plurality of light-emitting devices 3R, 3G, and 3B and a bank 17 provided on an array substrate 5. For example, the light-emitting devices 3R, 3G, and 3B form one pixel. Note that the display device 1 includes a display region in which a plurality of pixels are provided in a matrix shape to display an image, and a frame region surrounding a periphery of the display region. Note that the display device 1 may include a sealing layer that covers the light-emitting devices 3R, 3G, and 3B. The sealing layer can have a structure in which an inorganic layer formed using an inorganic insulating material and an organic layer formed using an organic insulating material such as a resin are layered, for example. Examples of the inorganic insulating material for forming the inorganic layer include silicon oxide, silicon nitride, and silicon oxynitride. Examples of the organic insulating material for forming the organic layer include acrylic and polyimide.

A light-emitting device (first light-emitting device) 3R emits, for example, red light (first color light). A light-emitting device (second light-emitting device, first light-emitting device) 3G emits green light (second color light, first color light) having a peak wavelength shorter than that of the red light. A light-emitting device (third light-emitting device, second light-emitting device) 3B emits blue light (third color light, second color light) having a peak wavelength shorter than that of the green light. Note that emission colors of the plurality of light-emitting devices included in the display device 1 are not limited to red, green, and blue, and may be any two colors thereof or may further include another color such as yellow.

Note that the red light refers to, for example, light having a peak wavelength in a wavelength band of greater than 600 nm and equal to or less than 780 nm. The green light refers to, for example, light having a peak wavelength in a wavelength band of greater than 500 nm and equal to or less than 600 nm. The blue light refers to, for example, light having a peak wavelength in a wavelength band of equal to or greater than 400 nm and equal to or less than 500 nm.

Further, the light-emitting devices 3B, 3G, and 3R are formed in regions demarcated by the bank 17, which is provided on the array substrate 5 and has an insulating property.

The array substrate 5 includes a base material 2, a plurality of thin film transistors 10, each of which is provided for each of the plurality of light-emitting devices 3B, 3G, and 3R, and an insulating layer 16 covering the plurality of thin film transistors 10.

The base material 2 may include a resin layer in order to have flexibility, or may be a hard substrate including glass or the like, for example. The resin layer included in the base material 2 can be formed of, for example, polyimide. In addition, the base material 2 may include an inorganic insulating layer provided on the resin layer or the glass substrate. The inorganic insulating layer is formed of silicon oxide, silicon nitride, or silicon oxynitride, for example.

The plurality of thin film transistors 10 are connected to the light-emitting devices 3B, 3G, and 3R, and are switching elements for performing switching between light emission and non-light emission of the light-emitting devices 3B, 3G, and 3R. Each of the plurality of thin film transistors 10 includes, for example, a gate electrode 11, a gate insulating layer 12 covering the gate electrode 11, a semiconductor layer 13 provided on the gate insulating layer 12, and a source electrode 14 and a drain electrode 15 provided on the semiconductor layer 13.

The gate electrode 11, the source electrode 14, and the drain electrode 15 are formed of a metal material such as copper or titanium, for example. The gate insulating layer 12 is formed of an inorganic insulating material such as silicon oxide, silicon nitride, or silicon oxynitride, for example. The semiconductor layer 13 is formed of, for example, indium gallium zinc oxide (IGZO), indium zinc oxide (IZO), gallium-added zinc oxide (GZO), aluminum-added zinc oxide (AZO), ZnO, $In_2O_3$, $Ga_2O_3$, or the like.

The insulating layer 16 is provided on the base material 2 to cover the plurality of thin film transistors 10. The insulating layer 16 is formed of an insulating resin material such as acrylic or polyimide, for example. Note that the insulating layer 16 may include an inorganic insulating layer. The inorganic insulating layer formed of an inorganic insulating material such as silicon oxide, silicon nitride, or silicon oxynitride, for example.

The light-emitting devices 3R, 3G, and 3B are provided on the insulating layer 16. A region where the light-emitting device 3R is formed (a region where the light-emitting device 3R is formed in FIG. 1) is referred to as a light-emitting device formation region (first region) ARr. A region where the light-emitting device 3G is formed (a region where the light-emitting device 3G is formed in FIG. 1) is referred to as a light-emitting device formation region (second region, first region) ARg. A region where the light-emitting device 3B is formed (a region where the light-emitting device 3B is formed in FIG. 1) is referred to as a light-emitting device formation region (third region, second region) ARb. Note that the light-emitting device formation region ARr, the light-emitting device formation region ARg, and the light-emitting device formation region ARb do not overlap with each other.

For example, each of the light-emitting devices 3R, 3G, and 3B has, what is called, an inverted structure. That is, for example, the light-emitting device 3R includes a cathode 21 provided on the array substrate 5, an electron transport layer 22 overlapping with the cathode 21, a light-emitting layer 20R overlapping with the electron transport layer 22, a hole transport layer 26 overlapping with the light-emitting layer 20R, and an anode 27 overlapping with the hole transport layer 26. Furthermore, for example, the light-emitting device 3G includes the cathode 21 provided on the array substrate 5, the electron transport layer 22 overlapping with the cathode 21, a light-emitting layer 20G overlapping with the electron transport layer 22, the hole transport layer 26 overlapping with the light-emitting layer 20G, and the anode 27 overlapping with the hole transport layer 26. Furthermore, for example, the light-emitting device 3B includes the cathode 21 provided on the array substrate 5, the electron transport layer 22 overlapping with the cathode 21, a light-emitting layer 20B overlapping with the electron transport layer 22, the hole transport layer 26 overlapping with the light-emitting layer 20B, and the anode 27 overlapping with the hole transport layer 26.

As an example, the light-emitting devices 3R, 3G, and 3B are of, what is called, a top emission type in which light emitted from the light-emitting layers 20R, 20G, and 20B is reflected by the cathode 21, transmitted through the hole transport layer 26 and the anode 27, and emitted from the light-emitting devices 3R, 3G, and 3B to the outside. That is, for example, of the cathode 21 and the anode 27, the cathode 21 is an electrode that reflects light emitted from the light-emitting layers 20R, 20G, and 20B, and the anode 27 is an electrode that extracts light emitted from the light-emitting layers 20R, 20G, and 20B, that is, an electrode that transmits visible light.

Note that the light-emitting devices 3R, 3G, and 3B may be of, what is called, a bottom emission type in which light emitted from the light-emitting layers 20R, 20G, and 20B is reflected by the anode 27, transmitted through the electron transport layer 22, the cathode 21, the anode 27, and the array substrate 5, and emitted from the light-emitting devices 3R, 3G, and 3B to the outside. In the case of the bottom emission type, of the cathode 21 and the anode 27, the cathode 21 is an electrode that extracts light emitted from the light-emitting layers 20R, 20G, and 20B, and the anode 27 is an electrode that reflects light emitted from the light-emitting layers 20R, 20G, and 20B.

The layered structure of each of the light-emitting devices 3R, 3G, and 3B is not limited to the above-described structure, and another layer may be provided between the cathode 21 and the anode 27. For example, each of the light-emitting devices 3R, 3G, and 3B may include an electron injection layer between the cathode 21 and the electron transport layer 22, or may include a hole injection layer between the anode 27 and the hole transport layer 26.

The light-emitting devices 3R, 3G, and 3B may have, what is called, a direct structure. The layering order in the case of the direct structure is opposite to the layering order in the case of the inverted structure. That is, for example, in the case of the direct structure, in the light-emitting device 3R, the anode 27 is layered on the array substrate 5, the hole transport layer 26 is layered on the anode 27, the light-emitting layer 20R is layered on the hole transport layer 26, the electron transport layer 22 is layered on the light-emitting layer 20R, and the cathode 21 is layered on the electron transport layer 22. Furthermore, for example, in the case of the direct structure, in the light-emitting device 3G, the anode 27 is layered on the array substrate 5, the hole transport layer 26 is layered on the anode 27, the light-emitting layer 20G is layered on the hole transport layer 26, the electron transport layer 22 is layered on the light-emitting layer 20G, and the cathode 21 is layered on the electron transport layer 22. Furthermore, for example, in the case of the direct structure, in the light-emitting device 3B, the anode 27 is layered on the array substrate 5, the hole transport layer 26 is layered on the anode 27, the light-emitting layer 20B is layered on the hole transport layer 26, the electron transport layer 22 is layered on the light-emitting layer 20B, and the cathode 21 is layered on the electron transport layer 22.

In the case of the direct structure, of the cathode 21 and the anode 27, the cathode 21 is an electrode that extracts light emitted from the light-emitting layers 20R, 20G, and 20B, that is, an electrode that transmits visible light, and the anode 27 is an electrode that reflects light emitted from the light-emitting layers 20R, 20G, and 20B.

The bank 17 is provided between the light-emitting devices 3R, 3G, and 3B to separate the light-emitting devices 3R, 3G, and 3B. The bank 17 is formed of, for example, an organic material such as polyimide or acrylic. For example, the bank 17 is formed so as to cover an edge of the cathode 21. With this configuration, the bank 17 also functions as an edge cover for the cathode 21, for example, so that it is possible to suppress generation of an excessive electrical field at each edge portion of the cathode 21.

In the light-emitting device 3R, the cathode 21 is an electrode to supply electrons to the light-emitting layer 20R, and the anode 27 is an electrode to supply holes to the light-emitting layer 20R. In the light-emitting device 3G, the cathode 21 is an electrode to supply electrons to the light-emitting layer 20G, and the anode 27 is an electrode to supply holes to the light-emitting layer 20G. In the light-emitting device 3B, the cathode 21 is an electrode to supply electrons to the light-emitting layer 20B, and the anode 27 is an electrode to supply holes to the light-emitting layer 20B.

In the light-emitting device 3R, the electron transport layer 22 transports electrons to the light-emitting layer 20R, and the hole transport layer 26 transports holes to the light-emitting layer 20R. In the light-emitting device 3G, the electron transport layer 22 transports electrons to the light-emitting layer 20G, and the hole transport layer 26 transports holes to the light-emitting layer 20G. In the light-emitting device 3B, the electron transport layer 22 transports electrons to the light-emitting layer 20B, and the hole transport layer 26 transports holes to the light-emitting layer 20B.

The cathode 21 is formed by using a metal material or a conductive transparent semiconductor material having a work function as small as possible to efficiently supply electrons to the electron transport layer 22, for example. Examples of the metal material for forming the cathode 21 include silver (Ag), aluminum (Al), and magnesium (Mg). Examples of the transparent semiconductor material for forming the cathode 21 include indium tin oxide (ITO), indium zinc oxide (IZO), aluminum-added zinc oxide (ZAO), and indium gallium zinc oxide (IGZO).

The electron transport layer 22 is formed by using an inorganic semiconductor material or an organic semiconductor material to transport electrons, for example. The electron transport layer 22 is preferably transparent. Examples of the inorganic semiconductor material include metal oxides such as ZnO and titanium oxide ($TiO_2$), and Group II-VI compound-based semiconductors having a band gap wider than that of the light-emitting layers 20R, 20G, and 20B.

The hole transport layer 26 is formed by using an inorganic semiconductor material or an organic semiconductor material to transport holes, for example. The hole transport layer 26 is preferably transparent. Specific examples of the inorganic semiconductor material used for the hole transport layer 26 include NiO, $Cr_2O_3$, MgO, $LaNiO_3$, $MoO_3$, $WO_3$, and the like.

The anode 27 is provided so as to face the cathode 21. The anode 27 is made of, for example, a conductive material having conductivity. Furthermore, the anode 27 is preferably transparent. Specific examples of the transparent conductive material include indium tin oxide (ITO), indium zinc oxide (IZO), tin oxide ($SnO_2$), fluorine-doped tin oxide (FTO), and the like.

Each of the light-emitting layers 20R, 20G, and 20B has a multilayer structure. Each of the light-emitting layers 20R, 20G, and 20B has a multilayer structure in which at least one layer is a light-emitting layer.

The light-emitting layer 20R includes, for example, a first layer 23R layered on the electron transport layer 22, a second layer 24Gp layered on the first layer 23R, and a third layer 25Bp layered on the second layer 24Gp.

The first layer 23R in the light-emitting layer 20R includes a plurality of quantum dots (first quantum dots) 33R that are semiconductor nanoparticles or the like that emit red light. The second layer 24Gp in the light-emitting layer 20R includes a plurality of quantum dots (first quantum dots, second quantum dots) 34Gp obtained by making a plurality of quantum dots (first quantum dots, second quantum dots) 34G, which are semiconductor nanoparticles or the like that emit green light, non-light-emitting and having a semiconductor conductivity type made p-type. The third layer 25Bp in the light-emitting layer 20R includes a plurality of quantum dots (second quantum dots, third quantum dots) 35Bp obtained by making a plurality of quantum dots (second quantum dots, third quantum dots) 35B, which are semiconductor nanoparticles or the like that emit blue light, non-light-emitting and having a semiconductor conductivity type made p-type.

The light-emitting layer 20G includes, for example, a first layer 23Rn layered on the electron transport layer 22, a second layer 24G layered on the first layer 23Rn, and a third layer 25Bp layered on the second layer 24G.

The first layer 23Rn in the light-emitting layer 20G includes a plurality of quantum dots (first quantum dots) 33Rn obtained by making a plurality of quantum dots (first quantum dots) 33R, which are semiconductor nanoparticles or the like that emit red light, non-light-emitting and having a semiconductor conductivity type made n-type. The second layer 24G in the light-emitting layer 20G includes a plurality of quantum dots (first quantum dots, second quantum dots) 34G that are semiconductor nanoparticles or the like that emit green light. The third layer 25Bp in the light-emitting layer 20G includes a plurality of quantum dots (second quantum dots, third quantum dots) 35Bp obtained by making a plurality of quantum dots (second quantum dots, third quantum dots) 35B, which are semiconductor nanoparticles or the like that emit blue light, non-light-emitting and having a semiconductor conductivity type made p-type.

The light-emitting layer 20B includes, for example, a first layer 23Rn layered on the electron transport layer 22, a second layer 24Gn layered on the first layer 23Rn, and a third layer 25B layered on the second layer 24Gn.

The first layer 23Rn in the light-emitting layer 20B includes a plurality of quantum dots (first quantum dots) 33Rn obtained by making a plurality of quantum dots (first quantum dots) 33R, which are semiconductor nanoparticles or the like that emit red light, non-light-emitting and having a semiconductor conductivity type made n-type. The second layer 24Gn in the light-emitting layer 20B includes a plurality of quantum dots (first quantum dots, second quantum dots) 34Gn obtained by making a plurality of quantum dots (first quantum dots, second quantum dots) 34G, which are semiconductor nanoparticles or the like that emit green light, non-light-emitting and having a semiconductor conductivity type made n-type. The third layer 25B in the light-emitting layer 20B includes a plurality of quantum dots (second quantum dots, third quantum dots) 35B that are semiconductor nanoparticles or the like that emit blue light.

The quantum dots 33R, 34G, 35B are each a light-emitting material that has a valence band maximum ((VBM), equal to an ionization potential) and a conduction band minimum ((CBM), equal to an electron affinity), and emits light through recombination of positive holes in the valence band level with electrons in the conduction band level. Light emitted from the quantum dots 33R, 34G, 35B has a narrower spectrum due to a quantum confinement effect.

For the quantum dots 33R, 34G, and 35B, materials generally used in the art can be used and, for example, Group II-VI compound semiconductors or Group III-V compound semiconductors can be used to form the quantum dots 33R, 34G, and 35B. Examples of the Group II-VI compound semiconductors include CdSe, ZnSe, and CdZnSe, and examples of the Group III-V compound semiconductors include InP and InN. Each of the quantum dots 33R, 34G, and 35B may have, what is called, a core-shell structure including a core and a shell covering the periphery of the core.

The quantum dots 33Rn and 33Rp are formed of the same material (for example, Group II-VI compound semiconductors or Group III-V compound semiconductors) as the quantum dots 33R, and have the same structure (for example, what is called, a core-shell structure) as the quantum dots 33R. However, the quantum dots 33Rn are different from the quantum dots 33R in that the quantum dots 33R are made non-light-emitting and have the semiconductor conductivity type made n-type. Furthermore, the quantum dots 33Rp are different from the quantum dots 33R in that the quantum dots 33R are made non-light-emitting and have the semiconductor conductivity type made p-type.

Each of the quantum dots 34Gn and 34Gp is formed of the same material (for example, Group II-VI compound semiconductors or Group III-V compound semiconductors) as the quantum dots 34G, and has the same structure (for example, what is called, a core-shell structure) as the quantum dots 34G. However, the quantum dots 34Gn are different from the quantum dots 34G in that the quantum dots 34G are made non-light-emitting and have the semiconductor conductivity type made n-type. Furthermore, the quantum dots 34Gp are different from the quantum dots 34G in that the quantum dots 34G are made non-light-emitting and have the semiconductor conductivity type made p-type.

Each of the quantum dots 35Bn and 35Bp is formed of the same material (for example, Group II-VI compound semiconductors or Group III-V compound semiconductors) as the quantum dots 35B, and has the same structure (for example, what is called, a core-shell structure) as the quantum dots 35B. However, the quantum dots 35Bn are different from the quantum dots 35B in that the quantum dots 35B are made non-light-emitting and have the semiconductor conductivity type made n-type. Furthermore, the quantum dots 35Bp are different from the quantum dots 35B in that the quantum dots 35B are made non-light-emitting and have the semiconductor conductivity type made p-type.

In the light-emitting layer 20R, the plurality of quantum dots 33R included in the first layer 23R, the plurality of quantum dots 34Gp included in the second layer 24Gp, and the plurality of quantum dots 35Bp included in the third layer 25Bp may be formed using different types of semiconductor materials or may be formed using the same type of semiconductor material. In the light-emitting layer 20R, in a case where the plurality of quantum dots 33R included in the first layer 23R, the plurality of quantum dots 34Gp included in the second layer 24Gp, and the plurality of quantum dots 35Bp included in the third layer 25Bp are formed using the same type of semiconductor material, an average particle size of the plurality of quantum dots 34Gp included in the second layer 24Gp is smaller than an average particle size of the plurality of quantum dots 33R included in the first layer 23R, and an average particle size of the plurality of quantum dots 35Bp included in the third layer 25Bp is smaller than the average particle size of the plurality of quantum dots 34Gp included in the second layer 24Gp.

In the light-emitting layer 20G, the plurality of quantum dots 33Rn included in the first layer 23Rn, the plurality of quantum dots 34G included in the second layer 24G, and the plurality of quantum dots 35Bp included in the third layer 25Bp may be formed using different types of semiconductor materials or may be formed using the same type of semiconductor material. In the light-emitting layer 20G, in a case where the plurality of quantum dots 33Rn included in the first layer 23Rn, the plurality of quantum dots 34G included in the second layer 24G, and the plurality of quantum dots 35Bp included in the third layer 25Bp are formed using the same type of semiconductor material, an average particle size of the plurality of quantum dots 34G included in the second layer 24G is smaller than an average particle size of the plurality of quantum dots 33Rn included in the first layer 23Rn, and an average particle size of the plurality of quantum dots 35Bp included in the third layer 25Bp is smaller than the average particle size of the plurality of quantum dots 34G included in the second layer 24G.

In the light-emitting layer 20B, the plurality of quantum dots 33Rn included in the first layer 23Rn, the plurality of quantum dots 34Gn included in the second layer 24Gn, and the plurality of quantum dots 35B included in the third layer 25B may be formed using different types of semiconductor materials or may be formed using the same type of semiconductor material. In the light-emitting layer 20B, in a case where the plurality of quantum dots 33Rn included in the first layer 23Rn, the plurality of quantum dots 34Gn included in the second layer 24Gn, and the plurality of quantum dots 35B included in the third layer 25B are formed using the same type of semiconductor material, an average particle size of the plurality of quantum dots 34Gn included in the second layer 24Gn is smaller than an average particle size of the plurality of quantum dots 33Rn included in the first layer 23Rn, and an average particle size of the plurality of quantum dots 35B included in the third layer 25B is smaller than the average particle size of the plurality of quantum dots 34Gn included in the second layer 24Gn.

In the light-emitting layer 20R, the second layer 24Gp and the third layer 25Bp are closer to the anode 27 than the first layer 23R that emits red light, and are provided between the first layer 23R and the anode 27. For this reason, the second layer 24Gp and the third layer 25Bp need to transport holes supplied from the anode 27 to the first layer 23R that emits red light. Thus, in the light-emitting layer 20R, the plurality of quantum dots 34Gp included in the second layer 24Gp and the plurality of quantum dots 34Bp included in the third layer 25B have the semiconductor conductivity type made p-type from among n-type and p-type. As a result, in the light-emitting device 3R, holes supplied from the anode 27 to the light-emitting layer 20R through the hole transport layer 26 are supplied through the third layer 25Bp and the second layer 24Gp to the first layer 24R that emits red light.

In the light-emitting layer 20G, the first layer 23Rn is closer to the cathode 21 than the second layer 24G that emits green light, and is provided between the second layer 24G and the cathode 21. For this reason, the first layer 23Rn needs to transport electrons supplied from the cathode 21 to the second layer 24G that emits green light. Thus, in the light-emitting layer 20G, the plurality of quantum dots 33Rn included in the first layer 23Rn have the semiconductor conductivity type made n-type from among n-type and p-type. As a result, in the light-emitting device 3G, electrons supplied from the cathode 21 to the light-emitting layer 20G through the electron transport layer 22 are supplied through the first layer 23Rn to the second layer 24G that emits green light.

In the light-emitting layer 20G, the third layer 25Bp is closer to the anode 27 than the second layer 24G that emits green light, and is provided between the second layer 24G and the anode 27. For this reason, the third layer 25Bp needs to transport holes supplied from the anode 27 to the second layer 24G that emits green light. Thus, in the light-emitting layer 20G, the plurality of quantum dots 35Bp included in the third layer 25Bp have the semiconductor conductivity type made p-type from among n-type and p-type. As a result, in the light-emitting device 3G, electrons supplied from the anode 27 to the light-emitting layer 20G through the hole transport layer 26 are supplied through the third layer 25Bp to the second layer 24G that emits green light.

In the light-emitting layer 20B, the first layer 23Rn and the second layer 24Gn are closer to the cathode 21 than the light-emitting layer 25B that emits blue light, and are provided between the third layer 25B and the cathode 21. For this reason, the first layer 23Rn and the second layer 24Gn need to transport electrons supplied from the cathode 21 to the third layer 25B that emits blue light. Thus, in the light-emitting layer 20B, the plurality of quantum dots 33Rn included in the first layer 23Rn and the plurality of quantum dots 34Gn included in the second layer 24Gn have the semiconductor conductivity type made n-type from among n-type and p-type. As a result, electrons supplied from the cathode 21 to the light-emitting layer 20B through the electron transport layer 22 are supplied through the first layer 23Rn and the second layer 24Gn to the third layer 25B that emits blue light.

Figure 2:
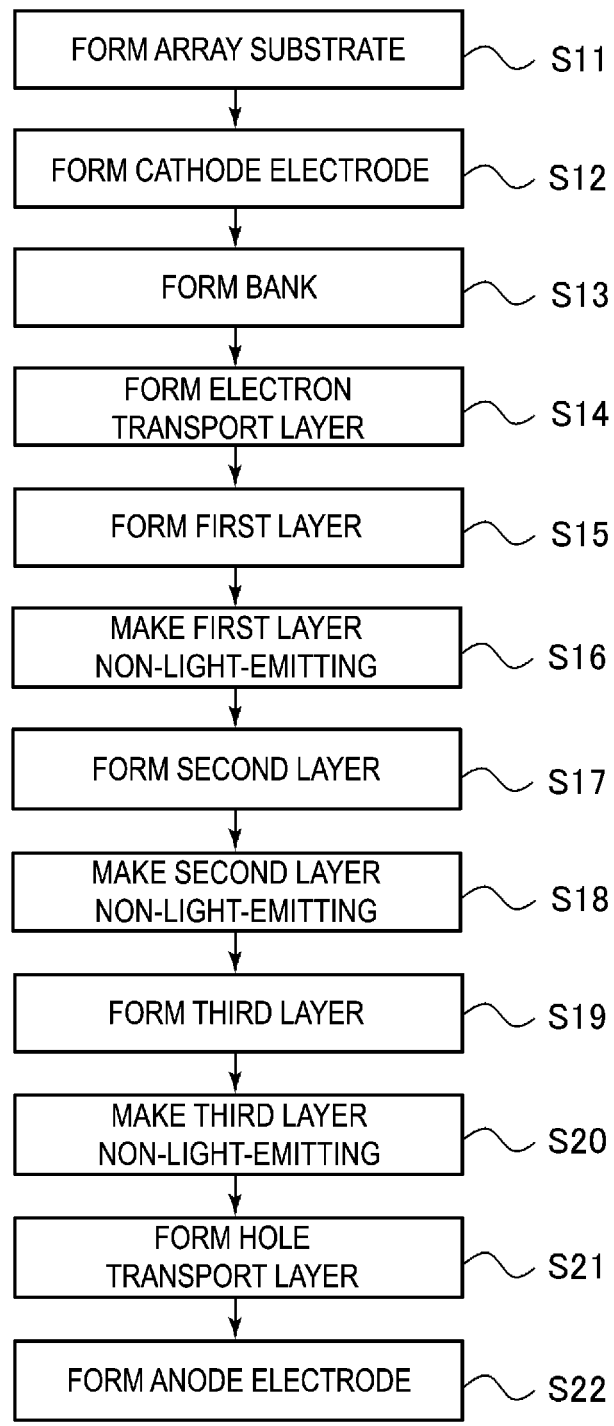
FIG. 2 is a flowchart illustrating a process of manufacturing the display device according to the embodiment.
Figure 3:
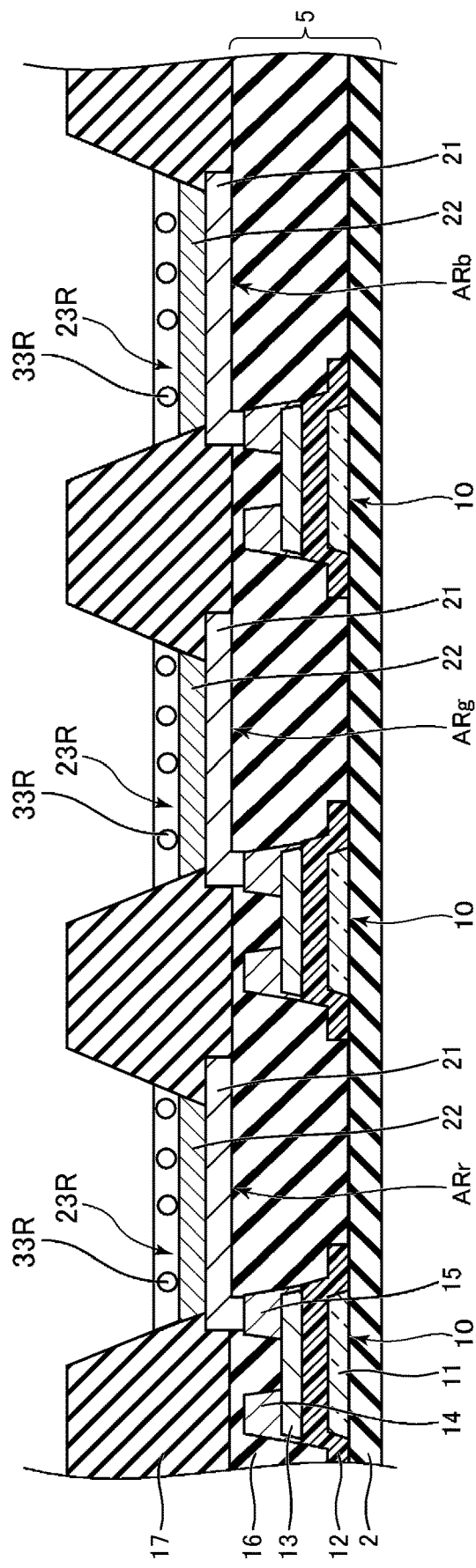
FIG. 3 is a diagram illustrating a state in which a first layer is formed in each light-emitting device formation region in the process of manufacturing the display device according to the embodiment.

Next, with reference to FIGS. 1 to 8, a process of manufacturing the display device 1 will be described. FIG. 2 is a flowchart illustrating the process of manufacturing the display device 1 according to the embodiment. FIG. 3 is a diagram illustrating a state in which the first layer 23R is formed in each of the light-emitting device formation regions ARr, ARg, and ARb in the process of manufacturing the display device 1 according to the embodiment.

As described in step S11 of FIG. 2 and illustrated in FIG. 3, the thin film transistors 10 are formed on the base material 2. Next, the insulating layer 16 is formed on the base material 2 to cover the thin film transistors 10. The insulating layer 16 can be formed by applying a solution in which an insulating material such as polyimide is dissolved, and baking, for example. In this way, the array substrate 5 is formed.

Then, as described in step S12 of FIG. 2 and illustrated in FIG. 3, the cathode 21 is formed on the insulating layer 16. Specifically, for example, the insulating layer 16 covering a part of the drain electrode 15 in each of the thin film transistors 10 is removed by ashing or the like to expose a part of the drain electrode 15. Then, the cathode 21 is formed into a predetermined shape in each of the light-emitting device formation regions ARr, ARg, and ARb on the insulating layer 16. As a result, the cathode 21 formed in each of the light-emitting device formation regions ARr, ARg, and ARb is electrically connected to the drain electrode 15, which is partially exposed, through a contact hole. The cathode 21 is formed by using a vapor deposition method or a sputtering method, for example.

The cathode 21 can be formed by layering, for example, a metal layer including Al, Cu, Au, Ag, or the like having high reflectivity of visible light, and a conductive layer of ITO, IZO, ZnO, AZO, BZO, GZO, or the like being a transparent material.

Next, as described in step S13 of FIG. 2 and illustrated in FIG. 3, the bank 17 is formed on the insulating layer 16. The bank 17 is formed in a lattice pattern in the display region, exposing the surface of the cathode 21 and demarcating the light-emitting device formation regions ARr, ARg, and ARb. As illustrated in FIG. 3, the bank 17 may be formed so as to cover an edge of the cathode 21. The bank 17 is formed by patterning by a photolithography method after applying an organic material such as polyimide or acrylic on the array substrate 5, for example.

Next, as described in step S14 of FIG. 2 and illustrated in FIG. 3, the electron transport layer 22 is formed on the cathode 21, in the region surrounded by the bank 17, in each of the light-emitting device formation regions ARr, ARg, and ARb. The electron transport layer 22 may be formed by, for example, applying and baking an inorganic material containing nanoparticles, or applying and baking a precursor solution, on the cathode 21. The electron transport layer 22 can be formed by using various methods such as a sputtering method in addition to applying and baking.

Then, as described in step S15 of FIG. 2 and illustrated in FIG. 3, the first layer 23R containing the quantum dots 33R is formed in the region surrounded by the bank 17, on the electron transport layer 22, in each of the light-emitting device formation region ARr, the light-emitting device formation region ARg, and the light-emitting device formation region ARb (step of forming the first layer). In the present embodiment, as an example, the first layer 23R is formed, but instead of the first layer 23R, a first layer including quantum dots that emit green light may be formed, or a first layer including quantum dots that emit blue light may be formed.

Specifically, for example, a colloidal solution containing the quantum dots 33R is applied onto the electron transport layer 22 in each of the light-emitting device formation region ARr, the light-emitting device formation region ARg, and the light-emitting device formation region ARb by an ink-jet method or the like.

After the colloidal solution is applied, the solvent is removed from the applied colloidal solution by baking at about 150° C. or lower for about 10 minutes, for example. Thus, the first layer 23R containing the quantum dots 33R is formed on the electron transport layer 22 in each of the light-emitting device formation region ARr, the light-emitting device formation region ARg, and the light-emitting device formation region ARb. In this way, when the first layer 23R is patterned by an ink-jet method or the like, patterning using photolithography, a vapor deposition method, or the like is unnecessary.

Figure 4:
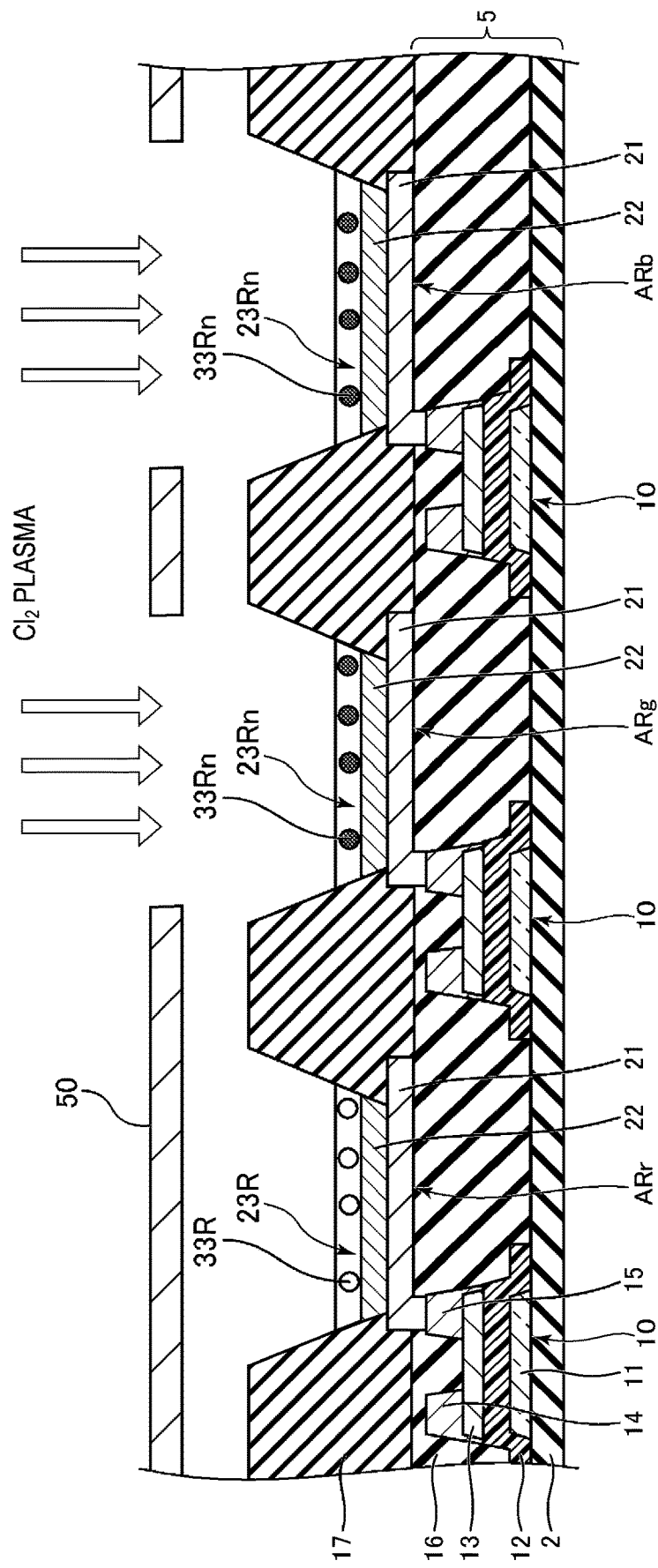
FIG. 4 is a diagram illustrating a state in which the first layer of each of a light-emitting device formation region of a light-emitting device that emits green light and a light-emitting device formation region of a light-emitting device that emits blue light is made non-light-emitting in the process of manufacturing the display device according to the embodiment.

FIG. 4 is a diagram illustrating a state in which the first layer of each of the light-emitting device formation region of the light-emitting device that emits green light and the light-emitting device formation region of the light-emitting device that emits blue light is made non-light-emitting in the process of manufacturing the display device 1 according to the embodiment.

Next, as described in step S16 of FIG. 2 and illustrated in FIG. 4, the first layer 23R in the light-emitting device formation region ARg is made non-light-emitting, and the first layer 23R in the light-emitting device formation region ARb is made non-light-emitting (step of making the first layer non-light-emitting). Note that in the step of making the first layer non-light-emitting, the first layer 23R in the light-emitting device formation region ARr is not made non-light-emitting.

Specifically, a mask 50 formed of, for example, a metal material is disposed facing the array substrate 5. In the mask 50, openings are formed in regions facing the light-emitting device formation region ARg and the light-emitting device formation region ARb in the array substrate 5. Note that the array substrate 5 and the mask 50 disposed facing the array substrate 5 may be in contact or not in contact with each other. However, when the mask 50 is disposed not in contact with the array substrate 5, it is possible to suppress damage to the array substrate 5 due to contact of the mask 50 with the array substrate 5 and to suppress entry of unintended foreign matters such as metal impurities.

Then, the array substrate 5 and the mask 50 disposed facing the array substrate 5 are inserted into a chamber of a plasma treatment apparatus. Then, the chamber is evacuated and a gas for inducing plasma is supplied into the chamber.

Here, the first layer 23R of the light-emitting device formation region ARg and the first layer 23R of the light-emitting device formation region ARb, which are layers to be made non-light-emitting, are layers closer to the cathode 21 than a light-emitting layer (the second layer 24G in the case of the light-emitting layer 20G and the third layer 25B in the case of the light-emitting layer 20B, as illustrated in FIG. 1 and the like) among the layers constituting the light-emitting layers 20G and 20B (see FIG. 1). For this reason, they are required not only to be made non-light-emitting but also to efficiently transport electrons supplied from the cathode 21 to the light-emitting layer among the layers constituting the light-emitting layers 20G and 20B (see FIG. 1).

Thus, for example, the quantum dots 33R contained in the first layer 23R of each of the light-emitting device formation regions ARg and ARb are irradiated with plasma serving as a donor to the material of the shells of the quantum dots 33R. For example, in a case where the material of the shells of the quantum dots 33R is a Group II-VI compound semiconductor, the first layer 23R of each of the light-emitting device formation regions ARg and ARb is irradiated with $Cl_2$ plasma serving as a donor to the Group II-VI compound semiconductor.

As the gas supplied into the evacuated chamber, for example, a mixed gas of Ar, $O_2$, and $Cl_2$ can be used. As the $Cl_2$ source, a gas such as $SiCl_4$, which is a type of gas used in plasma chemical vapor deposition (CVD), reactive ion etching (RIE), or the like, may be used.

As a result, the first layer 23R in the light-emitting device formation region ARg is subjected to the $Cl_2$ plasma treatment through the opening of the mask 50 to be made non-light-emitting, thereby becoming the first layer 23Rn. That is, by the $Cl_2$ plasma treatment, the quantum dots 33R contained in the first layer 23R in the light-emitting device formation region ARg become the quantum dots 33Rn made non-light-emitting and having the semiconductor conductivity type made n-type from among n-type and p-type.

The first layer 23R in the light-emitting device formation region ARb is subjected to the $Cl_2$ plasma treatment through the opening of the mask 50 to be made non-light-emitting, thereby becoming the first layer 23Rn. That is, by the $Cl_2$ plasma treatment, the quantum dots 33R contained in the first layer 23R in the light-emitting device formation region ARb become the quantum dots 33Rn made non-light-emitting and having the semiconductor conductivity type made n-type from among n-type and p-type.

That is, the first layer 23R in the light-emitting device formation region ARg becomes the first layer 23Rn containing the quantum dots 33Rn, and the first layer 23R in the light-emitting device formation region ARb becomes the first layer 23Rn containing the quantum dots 33Rn.

As a result, the first layer 23Rn in the light-emitting device formation region ARg is made non-light-emitting and can efficiently transport electrons supplied from the cathode 21 to the second layer 24G which is a light-emitting layer. The first layer 23Rn in the light-emitting device formation region ARb is made non-light-emitting and can transport electrons supplied from the cathode 21 to the second layer 24Gn layered thereon.

Note that for example, a thickness of the first layer 23Rn in each of the light-emitting device formation regions ARg and ARb is on the order of several tens of nanometers, and thus a discharge power in the $Cl_2$ plasma treatment is desirably low, and the discharge time may be short. Note that the first layer 23Rn in each of the light-emitting device formation region ARg and the light-emitting device formation region ARb containing the quantum dots 33Rn may contain Cl used for the plasma treatment. Further, the first layer 23R in the light-emitting device formation region ARr is not subjected to the $Cl_2$ plasma treatment by the mask 50 and is not made non-light-emitting.

In the case of the direct structure, the anode 27 is provided below each of the first layer of the light-emitting device formation region ARg and the first layer of the light-emitting device formation region ARb, and thus the semiconductor conductivity type of the quantum dots included in the first layer of the light-emitting device formation region ARg and the first layer of the light-emitting device formation region ARb is made p-type. This makes it possible for the first layer of the light-emitting device formation region ARg and the first layer of the light-emitting device formation region ARb to transport holes to the light-emitting layer. Note that in this case, $O_2$ plasma treatment or $N_2$ plasma treatment may be used as the plasma treatment for making the quantum dots p-type, and O or N may be contained in the first layer of the light-emitting device formation region ARg and the first layer of the light-emitting device formation region ARb.

Figure 5:
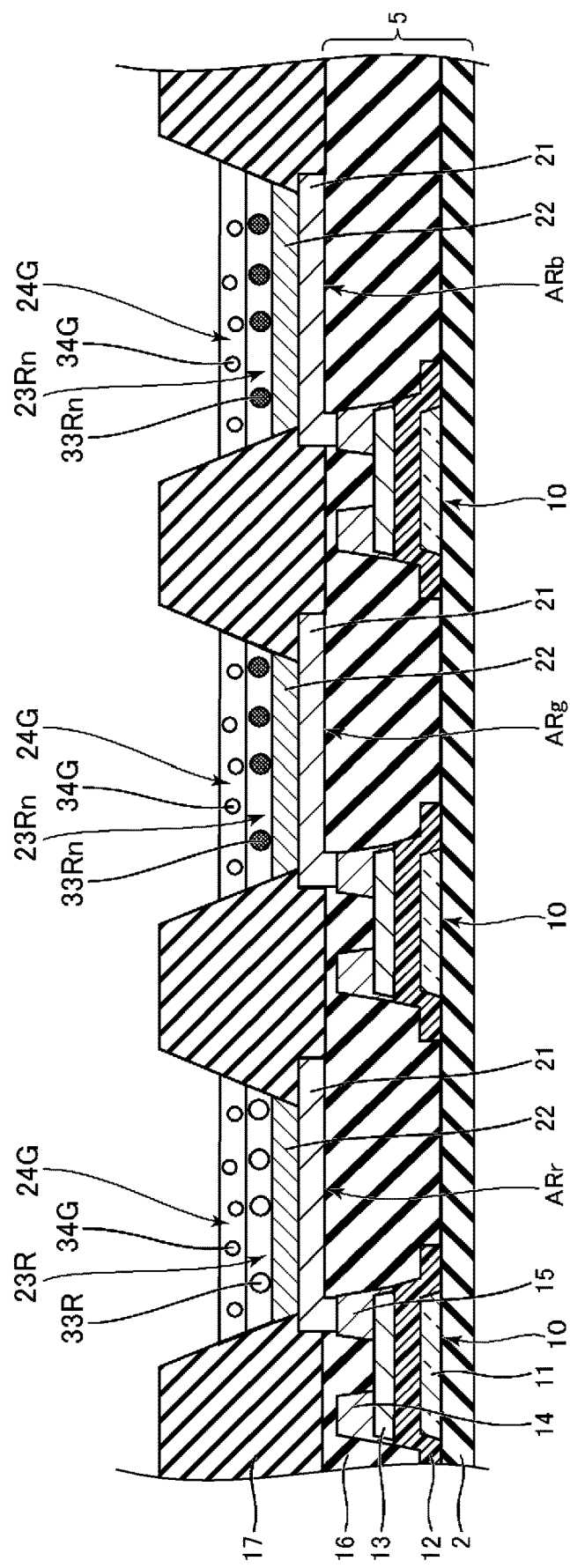
FIG. 5 is a diagram illustrating a state in which up to a second layer is layered in a light-emitting layer in the process of manufacturing the display device according to the embodiment.

FIG. 5 is a diagram illustrating a state in which up to a second layer is layered in the light-emitting layer in the process of manufacturing the display device 1 according to the embodiment.

Next, as described in step S17 of FIG. 2 and illustrated in FIG. 5, the second layer 24G is formed on the first layer 23R in the light-emitting device formation region ARr, on the first layer 23Rn in the light-emitting device formation region ARg, and on the first layer 23Rn in the light-emitting device formation region ARb, in the region surrounded by the bank 17 (step of forming the second layer). In the present embodiment, as an example, the second layer 24G is formed. However, in a case where the first layer includes quantum dots that emit green light, a second layer including quantum dots that emit red light or a second layer including quantum dots that emit blue light may be formed instead of the second layer 24G.

Specifically, the array substrate 5 and the mask 50 are taken out of the chamber of the plasma treatment apparatus, and the mask 50 disposed facing the array substrate 5 is removed.

Then, for example, a colloidal solution containing the quantum dots 34G is applied onto the first layer 23R in the light-emitting device formation region ARr, onto the first layer 23Rn in the light-emitting device formation region ARg, and onto the first layer 23Rn in the light-emitting device formation region ARb by an ink-jet method or the like.

After the colloidal solution is applied, the solvent is removed from the applied colloidal solution by baking at about 150° C. or lower for about 10 minutes, for example. In this way, the second layer 24G containing the quantum dots 34G is formed on the first layer 23R in the light-emitting device formation region ARr, on the first layer 23Rn in the light-emitting device formation region ARg, and on the first layer 23Rn in the light-emitting device formation region ARb. In this way, when the second layer 24G is patterned by an ink-jet method or the like, patterning using photolithography, a vapor deposition method, or the like is unnecessary.

Figure 6:
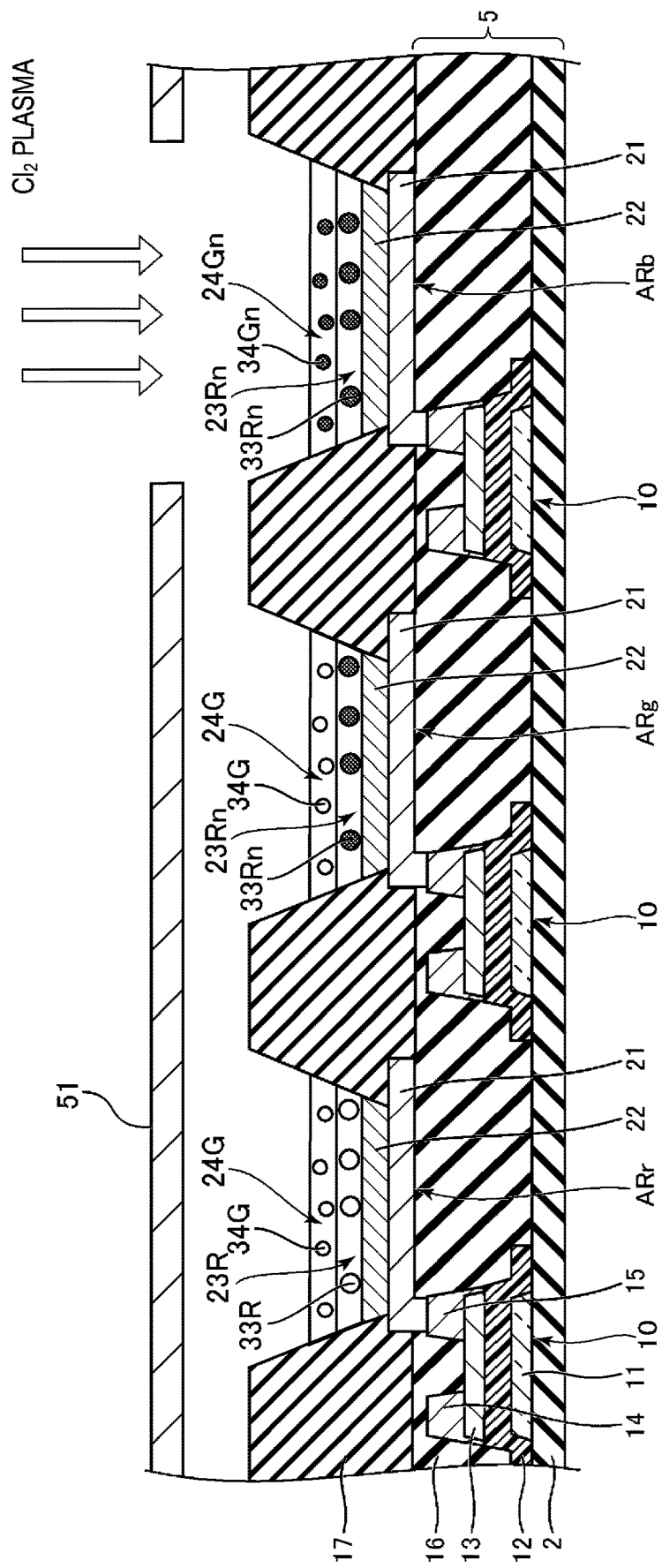
FIG. 6 is a diagram illustrating a state in which the second layer in the light-emitting device formation region of the light-emitting device that emits blue light is made non-light-emitting in the process of manufacturing the display device according to the embodiment.
Figure 7:
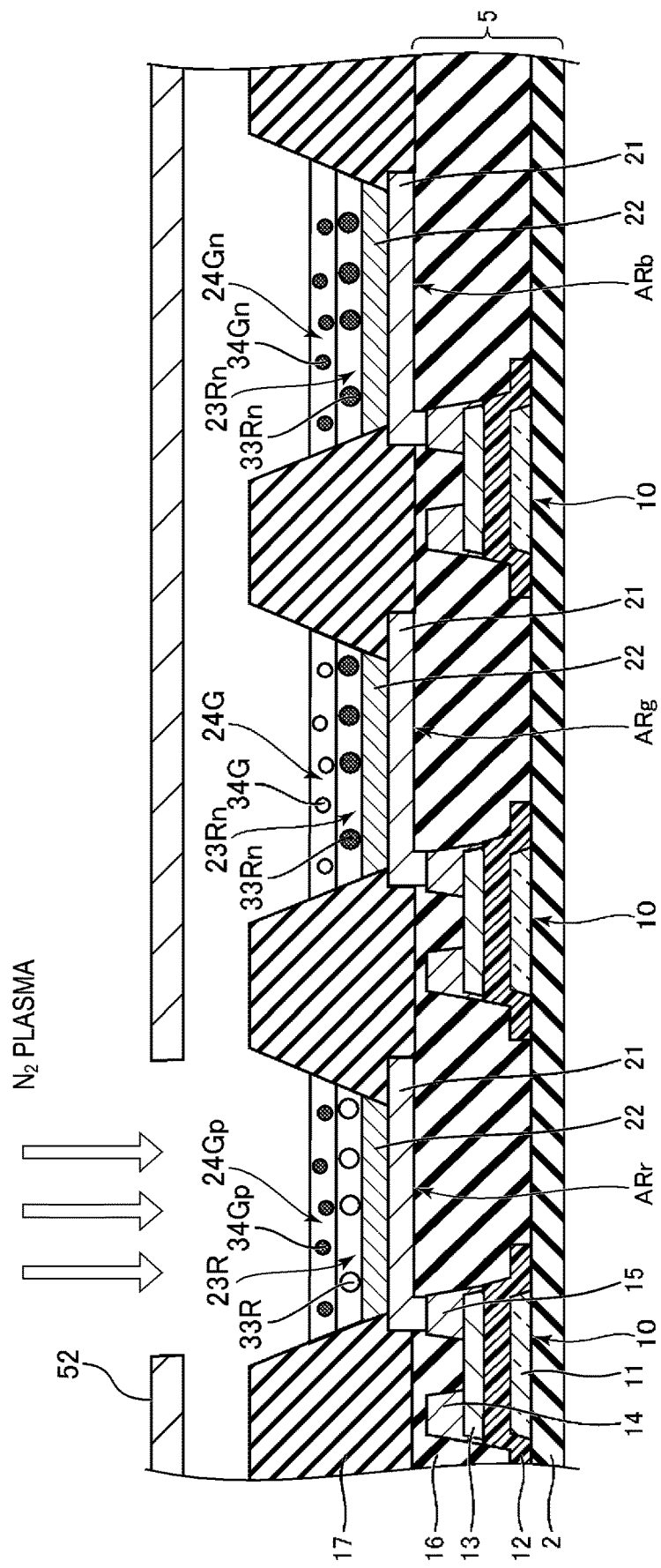
FIG. 7 is a diagram illustrating a state in which the second layer in a light-emitting device formation region of a light-emitting device that emits red light is made non-light-emitting in the process of manufacturing the display device according to the embodiment.

Next, as described in step S18 of FIG. 2 and illustrated in FIG. 6 and FIG. 7, the second layer 24G in the light-emitting device formation region ARb is made non-light-emitting, and the second layer 24G in the light-emitting device formation region ARr is made non-light-emitting (step of making the second layer non-light-emitting). Note that in the step of making the second layer non-light-emitting, the second layer 24G in the light-emitting device formation region ARg is not made non-light-emitting.

First, with reference to FIG. 6, a description will be given of a step of making, in the step of making the second layer non-light-emitting, the second layer 24G in the light-emitting device formation region ARb non-light-emitting. FIG. 6 is a diagram illustrating a state in which the second layer in the light-emitting device formation region of the light-emitting device that emits blue light is made non-light-emitting in the process of manufacturing the display device according to the embodiment.

For example, a mask 51 formed of a metal material or the like is disposed facing the array substrate 5. In the mask 51, an opening is formed in a region facing the light-emitting device formation region ARb in the array substrate 5. Note that the array substrate 5 and the mask 51 disposed facing the array substrate 5 may but need not be in contact with each other.

Then, the array substrate 5 and the mask 51 disposed facing the array substrate 5 are inserted into the chamber of the plasma treatment apparatus. Then, the chamber is evacuated and a gas for inducing plasma is supplied into the chamber.

Here, the second layer 24G of the light-emitting device formation region ARb, which is a layer to be made non-light-emitting, is a layer closer to the cathode 21 than the third layer 25B (see FIG. 1), which is a light-emitting layer among the layers constituting the light-emitting layer 20B (see FIG. 1). For this reason, it is required not only to be made non-light-emitting but also to efficiently transport electrons supplied from the cathode 21 to the third layer 25B.

Thus, for example, the quantum dots 34G contained in the second layer 24G of the light-emitting device formation region ARb are irradiated with plasma serving as a donor to the material of the shells of the quantum dots 34G. For example, in a case where the material of the shells of the quantum dots 34G is a Group II-VI compound semiconductor, the second layer 24G of the light-emitting device formation region ARb is irradiated with $Cl_2$ plasma serving as a donor to the Group II-VI compound semiconductor.

As the gas supplied into the evacuated chamber, for example, a mixed gas of Ar, $O_2$, and $Cl_2$ can be used. As the $Cl_2$ source, a gas such as $SiCl_4$, which is a type of gas used in plasma chemical vapor deposition (CVD), reactive ion etching (RIE), or the like, may be used.

As a result, the second layer 24G in the light-emitting device formation region ARb is subjected to the $Cl_2$ plasma treatment through the opening of the mask 51 to be made non-light-emitting, thereby becoming the second layer 24Gn. That is, by the $Cl_2$ plasma treatment, the quantum dots 34G contained in the second layer 24G in the light-emitting device formation region ARb become the quantum dots 34Gn made non-light-emitting and having the semiconductor conductivity type made n-type from among n-type and p-type. That is, the second layer 24G in the light-emitting device formation region ARb becomes the second layer 24Gn containing the quantum dots 34Gn.

As a result, the second layer 24Gn in the light-emitting device formation region ARb is made non-light-emitting and can efficiently transport electrons supplied from the cathode 21 to the third layer 25B which is a light-emitting layer.

Note that in this step, the second layer 23G in the light-emitting device formation region ARr and the second layer 23G in the light-emitting device formation region ARg are not subjected to the $Cl_2$ plasma treatment by the mask 51 and is not made non-light-emitting.

In addition, a type of gas supplied into the chamber and conditions for performing the $Cl_2$ plasma treatment may be the same as those in the step of making the first layer non-light-emitting described with reference to FIG. 4. Note that the second layer 24Gn in the light-emitting device formation region ARb may contain Cl used in the $Cl_2$ plasma treatment.

Note that in the case of the direct structure, the semiconductor conductivity type of the quantum dots included in the second layer of the light-emitting device formation region ARb is made p-type. In this case, $O_2$ plasma treatment or $N_2$ plasma treatment may be used as the plasma treatment for making the quantum dots p-type, and O or N may be contained in the second layer of the light-emitting device formation region ARb.

Next, with reference to FIG. 7, a description will be given of a step of making, in the step of making the second layer non-light-emitting, the second layer 24G in the light-emitting device formation region ARr non-light-emitting. FIG. 7 is a diagram illustrating a state in which the second layer in the light-emitting device formation region of the light-emitting device that emits red light is made non-light-emitting in the process of manufacturing the display device according to the embodiment.

Next, the mask 51 and the array substrate 5 are taken out of the chamber of the plasma treatment apparatus, and instead of the mask 51, a mask 52 formed of, for example, a metal material or the like, is disposed facing the array substrate 5. In the mask 52, an opening is formed in a region facing the light-emitting device formation region ARr in the array substrate 5. Note that the array substrate 5 and the mask 52 disposed facing the array substrate 5 may be in contact or not in contact with each other.

Then, the array substrate 5 and the mask 52 disposed facing the array substrate 5 are inserted into the chamber of the plasma treatment apparatus. Then, the chamber is evacuated and a gas for inducing plasma is supplied into the chamber.

Here, the second layer 24G of the light-emitting device formation region ARr, which is a layer to be made non-light-emitting, is a layer closer to the anode 27 (see FIG. 1) than the first layer 23R, which is a light-emitting layer among the layers constituting the light-emitting layer 20R (see FIG. 1). For this reason, it is required not only to be made non-light-emitting but also to efficiently transport holes supplied from the anode 27 to the first layer 23R.

Thus, the quantum dots 34G contained in the second layer 24G of the light-emitting device formation region ARr are made non-light-emitting in such a manner that the quantum dots 34G have, from among p-type and n-type, a semiconductor conductivity type different from that of the quantum dots 33Rn contained in the first layer 23Rn of the light-emitting device formation region ARg, the quantum dots 33Rn contained in the first layer 23Rn of the light-emitting device formation region ARb, and the quantum dots 34Gn contained in the second layer 24Gn of the light-emitting device formation region ARb.

For example, the quantum dots 34G contained in the second layer 24G of the light-emitting device formation region ARr are irradiated with plasma serving as an acceptor for the material of the shells of the quantum dots 34G. For example, in a case where the material of the shells of the quantum dots 34G is a Group II-VI compound semiconductor, the second layer 24G in the light-emitting device formation region ARr is irradiated with $N_2$ plasma serving as an acceptor for the Group II-VI compound semiconductor.

As the gas supplied into the evacuated chamber, for example, a mixed gas of Ar and $N_2$ can be used. Further, as the $N_2$ source, a gas such as $NH_3$, which is a type of gas used in plasma CVD, RIE, or the like, may be used.

As a result, the second layer 24G in the light-emitting device formation region ARr is subjected to the $N_2$ plasma treatment through the opening of the mask 52 to be made non-light-emitting, thereby becoming the second layer 24Gp. That is, by the $N_2$ plasma treatment, the quantum dots 34G contained in the second layer 24G in the light-emitting device formation region ARr become the quantum dots 34Gp made non-light-emitting and having the semiconductor conductivity type made p-type from among n-type and p-type.

That is, the second layer 24G in the light-emitting device formation region ARr becomes the second layer 24Gp containing the quantum dots 34Gp.

As a result, the second layer 24Gp in the light-emitting device formation region ARr is made non-light-emitting and can efficiently transport holes supplied from the anode 27 to the first layer 23R which is a light-emitting layer.

Note that the second layer 24G in the light-emitting device formation region ARg is not subjected to the $N_2$ plasma treatment by the mask 52 and is not made non-light-emitting.

Alternatively, instead of the $N_2$ plasma treatment, the quantum dots 34G contained in the second layer 24G in the light-emitting device formation region ARr may be made the quantum dots 34Gp that have been made non-light-emitting and have the semiconductor conductivity type made p-type by performing $O_2$ plasma treatment serving as an acceptor for the Group II-VI compound semiconductor. In the case of performing the $O_2$ plasma treatment, for example, a mixed gas of Ar and $O_2$ only need be supplied into the chamber instead of the mixed gas of Ar and $N_2$. Note that the second layer 24G in the light-emitting device formation region ARr may contain N or O used in the $N_2$ plasma treatment or the $O_2$ plasma treatment.

Note that in the case of the direct structure, the semiconductor conductivity type of the quantum dots included in the second layer of the light-emitting device formation region ARr is made n-type. In this case, $Cl_2$ plasma treatment may be used as the plasma treatment for making the quantum dots n-type, and Cl may be contained in the second layer of the light-emitting device formation region ARr.

Figure 8:
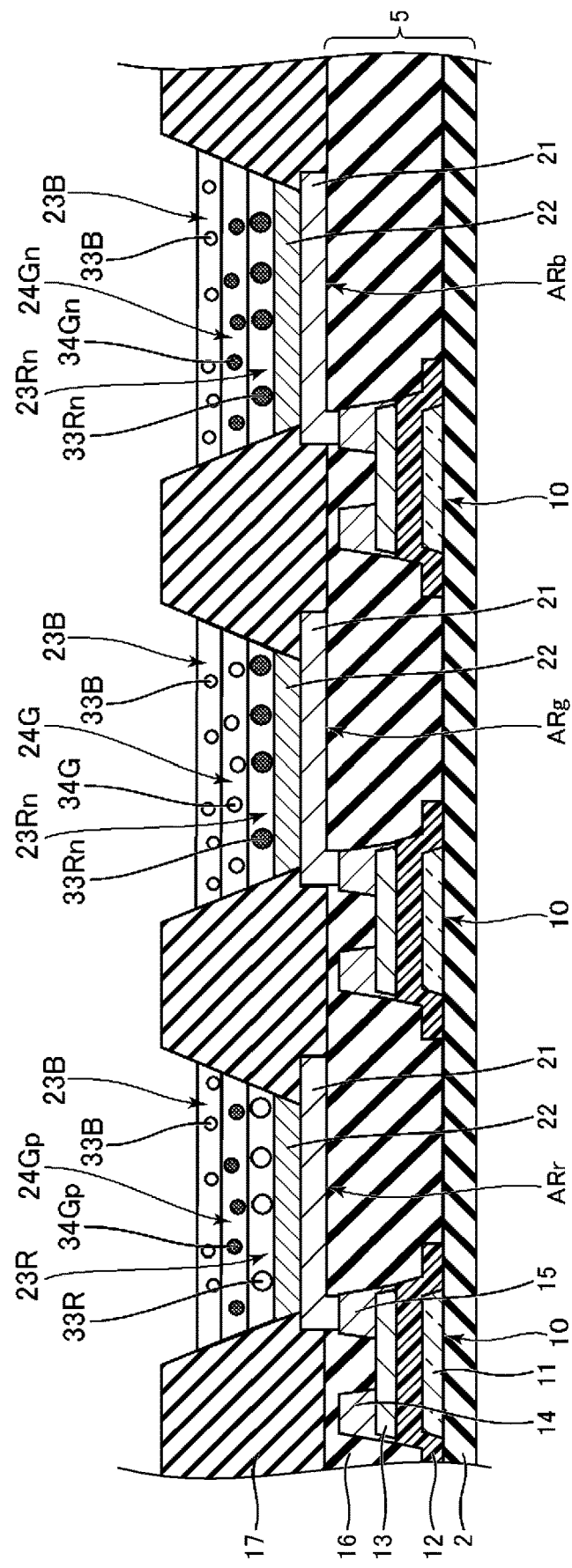
FIG. 8 is a diagram illustrating a state in which up to a third layer is layered in the light-emitting layer in the process of manufacturing the display device according to the embodiment.

FIG. 8 is a diagram illustrating a state in which up to a third layer is layered in the light-emitting layer in the process of manufacturing the display device 1 according to the embodiment.

Next, as described in step S19 of FIG. 2 and illustrated in FIG. 8, the third layer 25B containing the quantum dots 35B is formed on the second layer 24Gp in the light-emitting device formation region ARr, on the second layer 24G in the light-emitting device formation region ARg, and on the second layer 24Gn in the light-emitting device formation region ARb, in the region surrounded by the bank 17 (step of forming the third layer). In the present embodiment, as an example, the third layer 25B is formed. However, instead of the third layer 25B, a third layer including quantum dots that emit red light may be formed, or a third layer including quantum dots that emit green light may be formed.

Specifically, the array substrate 5 and the mask 52 are taken out of the chamber of the plasma treatment apparatus, and the mask 52 disposed facing the array substrate 5 is removed.

Then, for example, a colloidal solution containing the quantum dots 35B is applied onto the second layer 24Gp in the light-emitting device formation region ARr, onto the second layer 24G in the light-emitting device formation region ARg, and onto the second layer 24Gn in the light-emitting device formation region ARb by an ink-jet method or the like.

After the colloidal solution is applied, the solvent is removed from the applied colloidal solution by baking at about 150° C. or lower for about 10 minutes, for example. In this way, the third layer 25B containing the quantum dots 35B is formed on the second layer 24Gp in the light-emitting device formation region ARr, on the second layer 24G in the light-emitting device formation region ARg, and on the second layer 24Gn in the light-emitting device formation region ARb. In this way, when the third layer 25B is patterned by an ink-jet method or the like, patterning using photolithography, a vapor deposition method, or the like is unnecessary.

Figure 9:
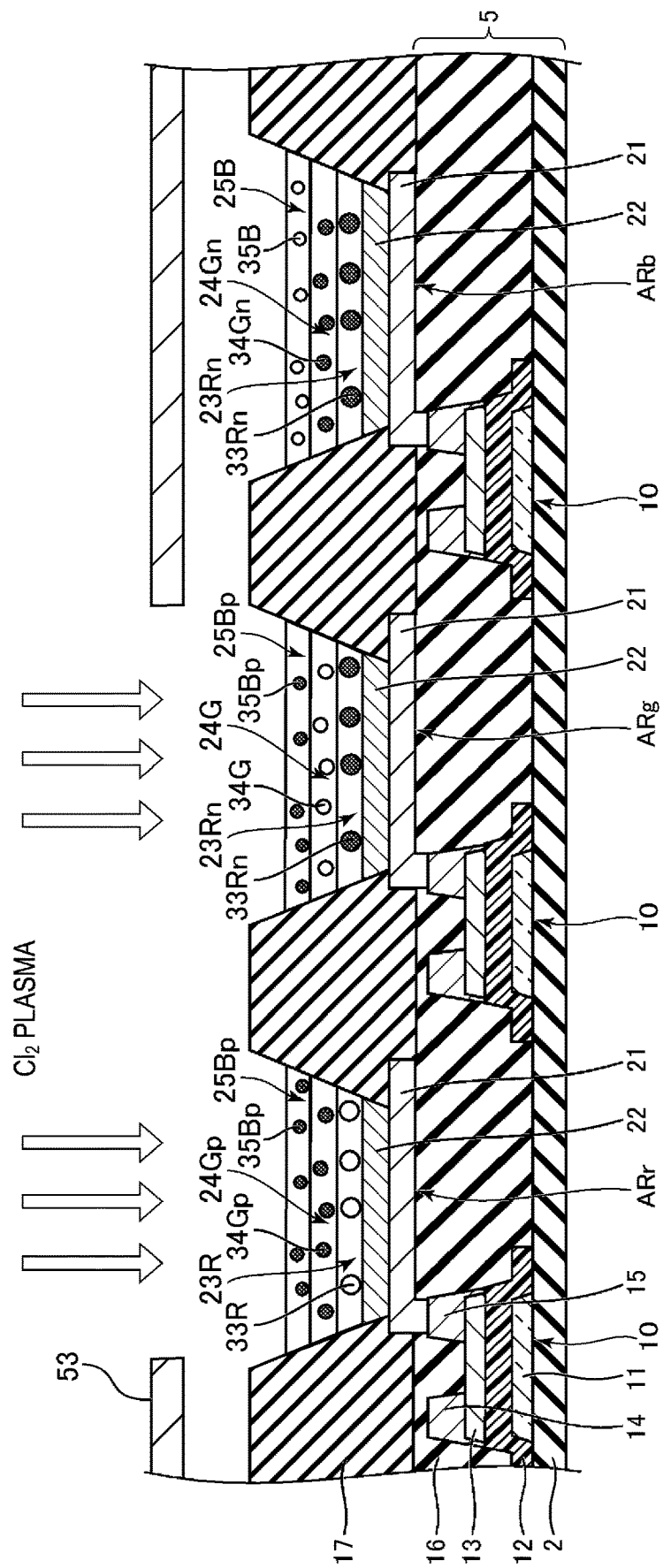
FIG. 9 is a diagram illustrating a state in which the third layer of each of the light-emitting device formation region of the light-emitting device that emits red light and the light-emitting device formation region of the light-emitting device that emits green light is made non-light-emitting in the process of manufacturing the display device according to the embodiment.

FIG. 9 is a diagram illustrating a state in which the third layer of each of the light-emitting device formation region of the light-emitting device that emits red light and the light-emitting device formation region of the light-emitting device that emits green light is made non-light-emitting in the process of manufacturing the display device according to the embodiment.

Next, as described in step S20 of FIG. 2 and illustrated in FIG. 9, the third layer 25B in the light-emitting device formation region ARr is made non-light-emitting, and the third layer 25G in the light-emitting device formation region ARg is made non-light-emitting (step of making the third layer non-light-emitting). Note that the third layer 25B in the light-emitting device formation region ARb is not made non-light-emitting.

For example, a mask 53 formed of a metal material or the like is disposed facing the array substrate 5. In the mask 53, openings are formed in regions facing the light-emitting device formation region ARr and the light-emitting device formation region ARg in the array substrate 5. Note that the array substrate 5 and the mask 53 disposed facing the array substrate 5 may be in contact or not in contact with each other.

Then, the array substrate 5 and the mask 53 disposed facing the array substrate 5 are inserted into the chamber of the plasma treatment apparatus. Then, the chamber is evacuated and a gas for inducing plasma is supplied into the chamber.

Here, the third layer 25B of the light-emitting device formation region ARr and the third layer 25B of the light-emitting device formation region ARg, which are layers to be made non-light-emitting, are layers closer to the anode 27 than a light-emitting layer (the first layer 23R in the case of the light-emitting layer 20R and the second layer 24G in the case of the light-emitting layer 20G, as illustrated in FIG. 1 and the like) among the layers constituting the light-emitting layers 20R and 20G (see FIG. 1). For this reason, they are required not only to be made non-light-emitting but also to efficiently transport holes supplied from the anode 27 to the light-emitting layer among the layers constituting the light-emitting layers 20R and 20G (see FIG. 1).

Thus, for example, the quantum dots 35B contained in the third layer 25B of each of the light-emitting device formation regions ARr and ARg are irradiated with plasma serving as an acceptor for the material of the shells of the quantum dots 35B. For example, in a case where the material of the shells of the quantum dots 35B is a Group II-VI compound semiconductor, the third layer 25B of each of the light-emitting device formation regions ARr and ARg is irradiated with $N_2$ plasma serving as an acceptor for the Group II-VI compound semiconductor.

As a result, the third layer 25B in the light-emitting device formation region ARr and the third layer 25B in the light-emitting device formation region ARg are each subjected to the $N_2$ plasma treatment through the opening of the mask 53 to be made non-light-emitting, thereby becoming the third layer 25Bp. That is, by the $N_2$ plasma treatment, each of the quantum dots 35B contained in the third layer 25B in the light-emitting device formation region ARr and the quantum dots 35B contained in the third layer 25B in the light-emitting device formation region ARg becomes the quantum dots 35Bp made non-light-emitting and having the semiconductor conductivity type made p-type from among n-type and p-type.

That is, each of the third layer 25B in the light-emitting device formation region ARr and the third layer 25B in the light-emitting device formation region ARg becomes the third layer 25Bp containing the quantum dots 35Bp.

As a result, the third layer 25Bp in the light-emitting device formation region ARr and the third layer 25Bp in the light-emitting device formation region ARg are made non-light-emitting and can efficiently transport holes supplied from the anode 27 to the first layer 23R which is a light-emitting layer. Note that the third layer 25Bp in each of the light-emitting device formation region ARr and the light-emitting device formation region ARg may contain N or O used in the $N_2$ plasma treatment or the $O_2$ plasma treatment.

Note that in the case of the direct structure, the conductivity type of the quantum dots included in the third layer of the light-emitting device formation region ARr and the conductivity type of the quantum dots included in the third layer of the light-emitting device formation region ARg are each made n-type. In this case, $Cl_2$ plasma treatment may be used to make each of the conductivity types of the quantum dots n-type, and Cl may be contained in the third layer of each of the light-emitting device formation region ARr and the light-emitting device formation region ARg.

In this way, in the light-emitting device formation region ARr, the light-emitting layer 20R including the first layer 23R, the second layer 24Gp layered on the first layer 23R, and the third layer 25Bp layered on the second layer 24Gp is completed. Further, in the light-emitting device formation region ARg, the light-emitting layer 20G including the first layer 23Rn, the second layer 24G layered on the first layer 23Rn, and the third layer 25Bp layered on the second layer 24G is completed. Further, in the light-emitting device formation region ARb, the light-emitting layer 20B including the first layer 23Rn, the second layer 24Gn layered on the first layer 23Rn, and the third layer 25B layered on the second layer 24Gn is completed.

Next, as described in step S21 of FIG. 2 and illustrated in FIG. 1, the hole transport layer 26 is formed on each of the third layer 25Bp of the light-emitting device formation region ARr, on the third layer 25Bp of the light-emitting device formation region ARg, and on the third layer 25B of the light-emitting device formation region ARb, in the region surrounded by the bank 17.

The hole transport layer 26 may be formed, for example, by applying and baking an inorganic material containing nanoparticles on the third layers 25Bp, 25Bp, and 25B, or by applying and baking a precursor solution. In addition to applying and baking, the hole transport layer 26 can be formed by various methods such as a sputtering method.

Next, as described in step S22 of FIG. 2 and illustrated in FIG. 1, the anode 27 is formed as a continuous layer covering the bank 17 and the hole transport layer 26 by a vapor deposition method, a sputtering method, or the like. The anode 27 is formed using, for example, a conductive material. Of the anode 27 and the cathode 21, the anode 27 is an electrode on a side on which light emitted from the light-emitting layers 20R, 20G, and 20B is extracted, and thus is preferably formed of a transparent material. Examples of the material forming the anode 27 include ITO, IZO, ZnO, AZO, BZO, and GZO.

Through the above-described steps, the light-emitting layer 20R is formed in which the first layer 23R, the second layer 24Gp, and the third layer 25Bp, which are a plurality of layers containing a plurality of quantum dots having average particle sizes different from each other, are layered. Further, the light-emitting layer 20G is formed in which the first layer 23Rn, the second layer 24G, and the third layer 25Bp, which are a plurality of layers containing a plurality of quantum dots having average particle sizes different from each other, are layered. Further, the light-emitting layer 20B is formed in which the first layer 23Rn, the second layer 24Gn, and the third layer 25B, which are a plurality of layers containing a plurality of quantum dots having average particle sizes different from each other, are layered.

Among the layers forming the light-emitting layer 20R, the second layer 24Gp and the third layer 25Bp other than the first layer 23R that emits red light are made non-light-emitting. Thus, the light-emitting device 3R including the light-emitting layer 20R can emit red light without mixing red light, green light, and blue light. Among the layers forming the light-emitting layer 20G, the first layer 23Rn and the third layer 25Bp other than the second layer 24G that emits green light are made non-light-emitting. Thus, the light-emitting device 3G including the light-emitting layer 20G can emit green light without mixing red light, green light, and blue light. Among the layers forming the light-emitting layer 20B, the first layer 23Rn and the second layer 24Gn other than the third layer 25B that emits blue light are made non-light-emitting. Thus, the light-emitting device 3B including the light-emitting layer 20B can emit blue light without mixing red light, green light, and blue light.

Note that in the case where the light-emitting devices 3R, 3G, and 3B have the direct structure, the order of steps S12, S14, and S21, and step S22 described in FIG. 2 only need be reversed.

As described above, the process of manufacturing the display device 1 includes step S15 of forming the first layer 23R containing the quantum dots 33R in the light-emitting device formation region ARr and the light-emitting device formation region ARg, step S16 of making the first layer 23R in the light-emitting device formation region ARg non-light-emitting to form the first layer 23Rn, step S17 of forming the second layer 24G including the quantum dots 34G in each of the light-emitting device formation region ARr and the light-emitting device formation region ARg, and step S18 of making the second layer 24G in the light-emitting device formation region ARr non-light-emitting to form the second layer 24Gp.

According to the display device 1 manufactured as described above, in the light-emitting layer 20R formed in the light-emitting device formation region ARr, the second layer 24Gp does not emit light because of being made non-light-emitting, and red light can be emitted from the first layer 23R. On the other hand, in the light-emitting layer 20G formed in the light-emitting device formation region ARg, the first layer 23Rn does not emit light because of being made non-light-emitting, and green light can be emitted from the second layer 24G.

As a result, control of the manufacturing process for patterning the light-emitting layer can be simplified as compared to a case where the light-emitting layer that emits red light is patterned only for the light-emitting device that emits red light or the light-emitting layer that emits green light is patterned only for the light-emitting device that emits green light by using, for example, separate deposition or photolithography. This makes it possible to obtain the display device 1 in which occurrence of light emission unevenness and occurrence of color mixing are suppressed.

In the case of the inverted structure, in step S16 of making the first layer 23Rn non-light-emitting, the first layer 23Rn in the light-emitting device formation region ARg is closer to the cathode 21 than the second layer 24G that emits light. Thus, the semiconductor conductivity type of the quantum dots 33Rn included in the first layer 23Rn in the light-emitting device formation region ARg is made n-type. In step S18 of making the second layer 24Gp non-light-emitting, the second layer 24Gp in the light-emitting device formation region ARr is closer to the anode 27 than the first layer 23R that emits light. Thus, the semiconductor conductivity type of the quantum dots 34Gp included in the second layer 24Gp in the light-emitting device formation region ARr is made p-type, which is different from that of the quantum dots 33Rn included in the first layer 23Rn in the light-emitting device formation region ARg, which are made n-type.

As a result, in the light-emitting device 3G formed in the light-emitting device formation region ARg, the first layer 23Rn can supply electrons to the second layer 24G that emits light. In the light-emitting device 3R formed in the light-emitting device formation region ARr, the second layer 24Gp can supply holes to the first layer 23R that emits light. This makes it possible for the first layer 23R and the second layer 24G to efficiently emit light.

Note that in the case of the direct structure, in step S16 of making the first layer 23Rn non-light-emitting, the first layer 23Rn in the light-emitting device formation region ARg is closer to the anode 27 than the second layer 24G that emits light. Thus, the semiconductor conductivity type of the quantum dots included in the first layer in the light-emitting device formation region ARg is made p-type. In step S18 of making the second layer non-light-emitting, the second layer in the light-emitting device formation region ARr is closer to the cathode 21 than the first layer that emits light. Thus, the semiconductor conductivity type of the quantum dots included in the second layer in the light-emitting device formation region ARr is made n-type, which is different from that of the quantum dots included in the first layer in the light-emitting device formation region ARg, which are made p-type.

Further, in step S15 of forming the first layer, the first layer 23R is also formed in the light-emitting device formation region ARb, and in step S16 of making the first layer non-light-emitting, the first layer 23R in the light-emitting device formation region ARb is also made non-light-emitting to form the first layer Rn. In addition, in step S17 of forming the second layer, the second layer 24G is also formed in the light-emitting device formation region ARb, and in step S18 of making the second layer non-light-emitting, the second layer 24G in the light-emitting device formation region ARb is also made non-light-emitting to form the second layer 24Gn.

The method for manufacturing the display device 1 further includes step S19 of forming the third layer 25B including the quantum dots 35B in each of the light-emitting device formation regions ARr, ARg, and ARb, and step S20 of making the third layer 25B in each of the light-emitting device formation regions ARr and ARg non-light-emitting to form the third layer 35Bp. Accordingly, the light-emitting layer 20B that emits blue light can be formed by a further simple manufacturing process.

Note that in the case of the direct structure, in the step of making the third layer non-light-emitting, it is only required to make the quantum dots included in the third layer in the light-emitting device formation region ARr n-type, and make the quantum dots included in the third layer in the light-emitting device formation region ARg n-type.

As illustrated in FIG. 1, each of the light-emitting layers 20R, 20G, and 20B has a configuration in which a first layer, a second layer, and a third layer including quantum dots with different average particle sizes are layered.

In the first layer, the second layer, and the third layer, as patterns of combinations of a position of a light-emitting layer, a position of a layer including quantum dots whose semiconductor conductivity type has been made n-type, and a position of a layer including quantum dots whose semiconductor conductivity type has been made p-type, there are 36 patterns, taking into consideration whether light emitted from the light-emitting layer is absorbed by another layer, whether carriers (electrons and holes) are supplied to the light-emitting layer, whether the layers are layered in a direct structure or an inverted structure, and the like.

With reference to FIGS. 10 to 15, patterns of combinations of the first layer, the second layer, and the third layer of each of the light-emitting layers 20R, 20G, and 20B, and degrees of carrier injection efficiency and light absorption will be described.

Figure 10:
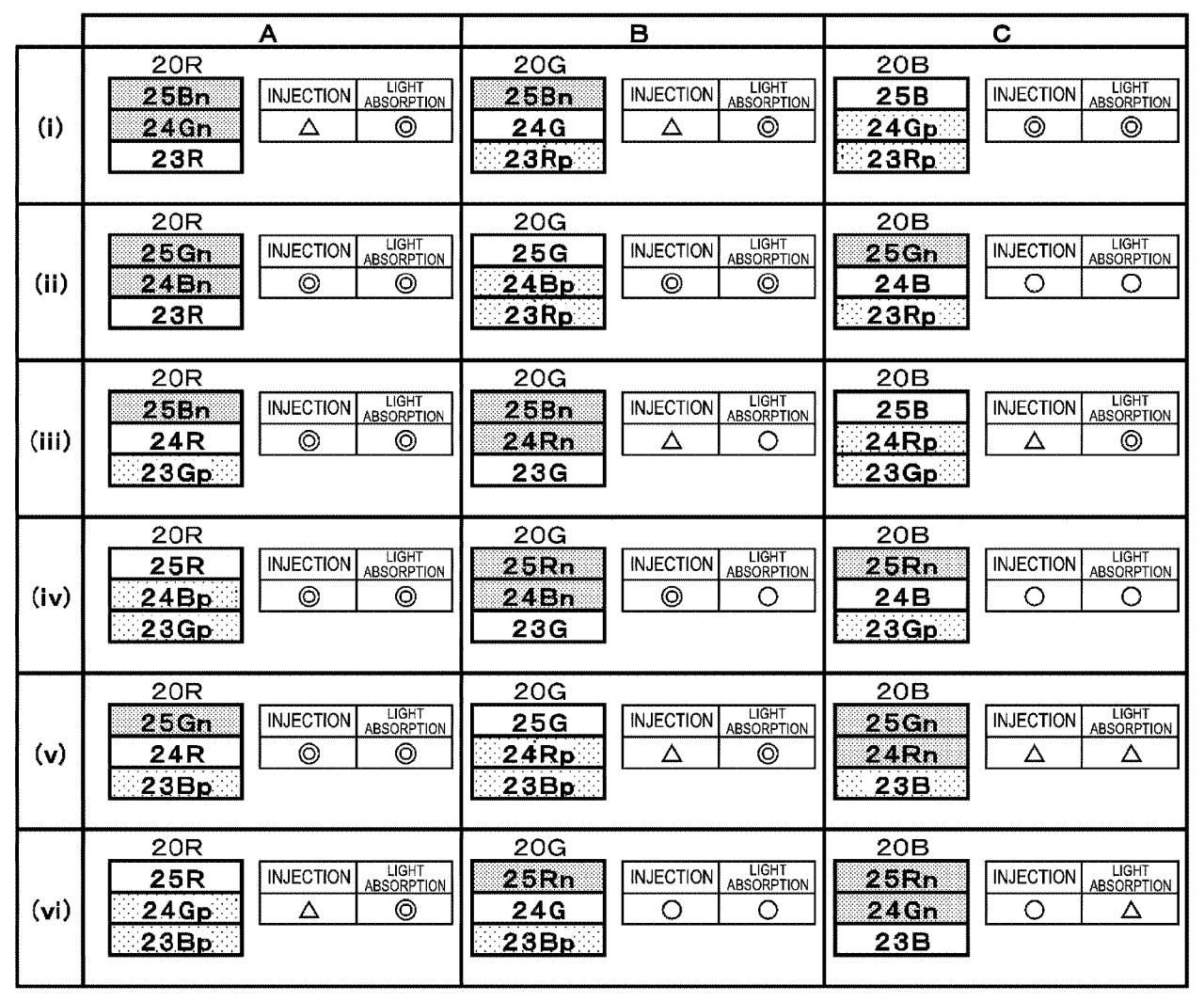
Figure 11:
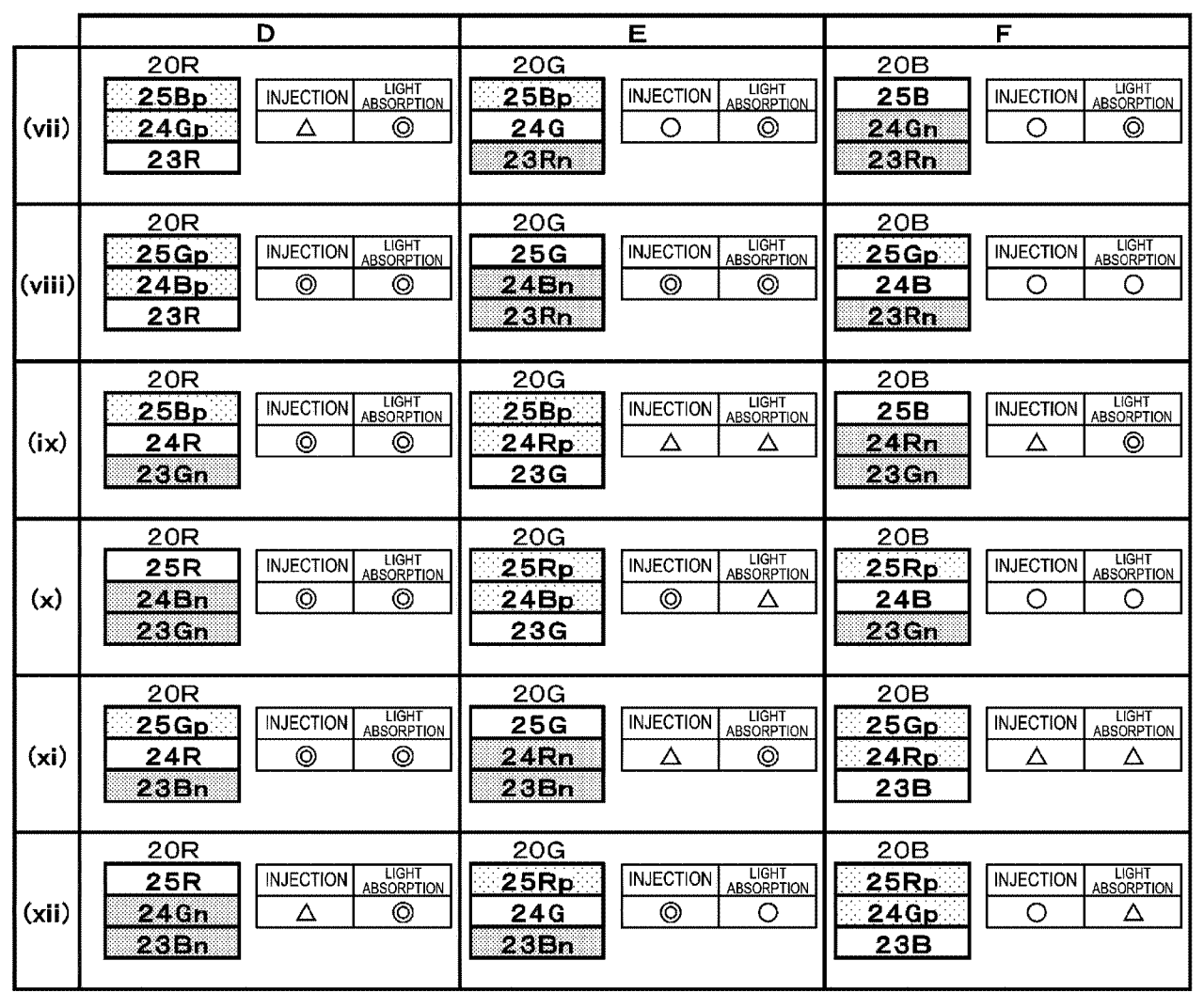

FIG. 10 is a diagram showing patterns of combinations of the first layer, the second layer, and the third layer forming each of the light-emitting layers 20R, 20G, and 20B, and degrees of carrier injection efficiency and light absorption in a case where the light-emitting devices 3R, 3G, and 3B have a direct structure. FIG. 11 is a diagram showing variations of the first layer, the second layer, and the third layer forming each of the light-emitting layers 20R, 20G, and 20B, and degrees of carrier injection efficiency and light absorption in a case where the light-emitting devices 3R, 3G, and 3B have an inverted structure.

In the case where the light-emitting devices 3R, 3G, and 3B have the direct structure shown in FIG. 10, in the light-emitting device 3R, for example, the anode 27, the hole transport layer 26, the first layer of the light-emitting layer 20R, the second layer of the light-emitting layer 20R, the third layer of the light-emitting layer 20R, the electron transport layer 22, and the cathode 21 are layered in this order on the array substrate 5. Furthermore, in the light-emitting device 3G, for example, the anode 27, the hole transport layer 26, the first layer of the light-emitting layer 20G, the second layer of the light-emitting layer 20G, the third layer of the light-emitting layer 20G, the electron transport layer 22, and the cathode 21 are layered in this order on the array substrate 5. In the light-emitting device 3B, for example, the anode 27, the hole transport layer 26, the first layer of the light-emitting layer 20B, the second layer of the light-emitting layer 20B, the third layer of the light-emitting layer 20B, the electron transport layer 22, and the cathode 21 are layered in this order on the array substrate 5.

Here, it is assumed that the light-emitting devices 3R, 3G, and 3B are of the top emission type. In the case where the light-emitting devices 3R, 3G, and 3B have the direct structure, of the cathode 21 and the anode 27, the cathode 21 is an electrode that extracts light and the anode 27 is an electrode that reflects light. Among the first, second, and third layers forming each of the light-emitting layers 20R, 20G, and 20B, a layer above the light-emitting layer is a layer closer to the cathode 21 than the light-emitting layer (i.e., a layer that supplies electrons to the light-emitting layer), and a layer below the light-emitting layer is a layer closer to the anode 27 than the light-emitting layer (i.e., a layer that supplies holes to the light-emitting layer).

In the case where the light-emitting devices 3R, 3G, and 3B have the inverted structure shown in FIG. 11, in the light-emitting device 3R, for example, the cathode 21, the electron transport layer 22, the first layer of the light-emitting layer 20R, the second layer of the light-emitting layer 20R, the third layer of the light-emitting layer 20R, the hole transport layer 26, and the anode 27 are layered in this order on the array substrate 5. Furthermore, in the light-emitting device 3G, for example, the cathode 21, the electron transport layer 22, the first layer of the light-emitting layer 20G, the second layer of the light-emitting layer 20G, the third layer of the light-emitting layer 20G, the hole transport layer 26, and the anode 27 are layered in this order on the array substrate 5. In the light-emitting device 3B, for example, the cathode 21, the electron transport layer 22, the first layer of the light-emitting layer 20B, the second layer of the light-emitting layer 20B, the third layer of the light-emitting layer 20B, the hole transport layer 26, and the anode 27 are layered in this order on the array substrate 5.

Here, it is assumed that the light-emitting devices 3R, 3G, and 3B are of the top emission type. In the case where the light-emitting devices 3R, 3G, and 3B have the inverted structure, of the cathode 21 and the anode 27, the anode 27 is an electrode that extracts light and the cathode 21 is an electrode that reflects light. Among the first, second, and third layers forming each of the light-emitting layers 20R, 20G, and 20B, a layer above the light-emitting layer is a layer closer to the cathode 21 than the light-emitting layer (i.e., a layer that supplies holes to the light-emitting layer), and a layer below the light-emitting layer is a layer closer to the anode 27 than the light-emitting layer (i.e., a layer that supplies electrons to the light-emitting layer).

FIG. 10 and FIG. 11 show patterns of emission colors and conductivity types of the first layer, the second layer, and the third layer in order from the lower layer to the upper layer in each of the light-emitting layers 20R, 20G, and 20B.

That is, in the tables shown in FIG. 10 and FIG. 11, the numeral "23" represents the first layer, the numeral "24" represents the second layer, and the numeral "25" represents the third layer. "R", "G", and "B" next to the numeral "23", "24", or "25" represent that a plurality of quantum dots emitting red light if not made non-light-emitting are contained, that a plurality of quantum dots emitting green light if not made non-light-emitting are contained, and that a plurality of quantum dots emitting blue light if not made non-light-emitting are contained, respectively. In addition, "n" or "p" next to "R", "G", or "B" represents that the plurality of quantum dots are made non-light-emitting and have the semiconductor conductivity type made n-type, or that the plurality of quantum dots are made non-light-emitting and have the semiconductor conductivity type made p-type, respectively, and when neither "n" nor "p" is attached, it represents that the plurality of quantum dots are not made non-light-emitting and emit light.

In FIG. 10 and FIG. 11, when defining lateral lines as rows and vertical lines as columns in the cells, rows (i) to (xii) represent variations of the conductivity types of a plurality of quantum dots contained in the first, second, and third layers forming each of the light-emitting layers 20R, 20G, and 20B in combinations of the first layer, the second layer, and the third layer, in a case where the plurality of quantum dots that emit light of the same color if not made non-light-emitting are contained in the first, second, and third layers.

Column A in FIG. 10 and column D in FIG. 11 represent variations of the conductivity types of the plurality of quantum dots contained in the first layer, the second layer, and the third layer forming the light-emitting layer 20R. Column B in FIG. 10 and column E in FIG. 11 represent variations of the conductivity types of the plurality of quantum dots contained in the first layer, the second layer, and the third layer forming the light-emitting layer 20G. Column C in FIG. 10 and column F in FIG. 11 represent variations of the conductivity types of the plurality of quantum dots contained in the first layer, the second layer, and the third layer forming the light-emitting layer 20B.

For example, in FIG. 10 showing the direct structure, the first layer 23R of the light-emitting layer 20R shown in row (i) and column A includes a plurality of quantum dots that emit red light and are not made non-light-emitting. The second layer 23Rp of the light-emitting layer 20G shown in row (i) and column B includes a plurality of quantum dots that emit red light if not made non-light-emitting, but are made non-light-emitting and have the semiconductor conductivity type made p-type. The first layer 23Rp of the light-emitting layer 20B shown in row (i) and column C includes a plurality of quantum dots that emit red light if not made non-light-emitting, but are made non-light-emitting and have the semiconductor conductivity type made p-type.

The second layer 24Gn of the light-emitting layer 20R shown in row (i) and column A includes a plurality of quantum dots that emit green light if not made non-light-emitting, but are made non-light-emitting and have the semiconductor conductivity type made n-type. The second layer 24G of the light-emitting layer 20G shown in row (i) and column B includes a plurality of quantum dots that emit green light and are not made non-light-emitting. The second layer 24Gp of the light-emitting layer 20B shown in row (i) and column C includes a plurality of quantum dots that emit green light if not made non-light-emitting, but are made non-light-emitting and have the semiconductor conductivity type made p-type.

The third layer 25Bn of the light-emitting layer 20R shown in row (i) and column A includes a plurality of quantum dots that emit blue light if not made non-light-emitting, but are made non-light-emitting and have the semiconductor conductivity type made n-type. The third layer 25Bn of the light-emitting layer 20G shown in row (i) and column B includes a plurality of quantum dots that emit blue light if not made non-light-emitting, but are made non-light-emitting and have the semiconductor conductivity type made n-type. The third layer 25B of the light-emitting layer 20B shown in row (i) and column C includes a plurality of quantum dots that emit blue light and are not made non-light-emitting.

For example, in FIG. 10 showing the direct structure, the first layer 23R of the light-emitting layer 20R shown in row (ii) and column A contains a plurality of quantum dots that emit red light and are not made non-light-emitting. The first layer 23Rp of the light-emitting layer 20G shown in row (ii) and column B includes a plurality of quantum dots that emit red light if not made non-light-emitting, but are made non-light-emitting and have the semiconductor conductivity type made p-type. The first layer 23Rp of the light-emitting layer 20B shown in row (ii) and column C includes a plurality of quantum dots that emit red light if not made non-light-emitting, but are made non-light-emitting and have the semiconductor conductivity type made p-type.

The second layer 24Bn of the light-emitting layer 20R shown in row (ii) and column A includes a plurality of quantum dots that emit blue light if not made non-light-emitting, but are made non-light-emitting and have the semiconductor conductivity type made n-type. The second layer 24Bp of the light-emitting layer 20G shown in row (ii) and column B includes a plurality of quantum dots that emit blue light if not made non-light-emitting, but are made non-light-emitting and have the semiconductor conductivity type made p-type. The second layer 24B of the light-emitting layer 20B shown in row (ii) and column C includes a plurality of quantum dots that emit blue light and are not made non-light-emitting.

The third layer 25Gn of the light-emitting layer 20R shown in row (ii) and column A includes a plurality of quantum dots that emit green light if not made non-light-emitting, but are made non-light-emitting and have the semiconductor conductivity type made n-type. The third layer 25G of the light-emitting layer 20G shown in row (ii) and column B includes a plurality of quantum dots that emit green light and are not made non-light-emitting. The third layer 25Gn of the light-emitting layer 20B shown in row (ii) and column C includes a plurality of quantum dots that emit green light if not made non-light-emitting, but are made non-light-emitting and have the semiconductor conductivity type made n-type.

For example, in FIG. 10 showing the direct structure, the first layer 23Gp of the light-emitting layer 20R shown in row (iii) and column A includes a plurality of quantum dots that emit green light if not made non-light-emitting, but are made non-light-emitting and have the semiconductor conductivity type made p-type. The first layer 23G of the light-emitting layer 20G shown in row (iii) and column B includes a plurality of quantum dots that emit green light and are not made non-light-emitting. The first layer 23Gp of the light-emitting layer 20B shown in row (iii) and column C includes a plurality of quantum dots that emit green light if not made non-light-emitting, but are made non-light-emitting and have the semiconductor conductivity type made p-type.

The second layer 24R of the light-emitting layer 20R shown in row (iii) and column A includes a plurality of quantum dots that emit red light and are not made non-light-emitting. The second layer 24Rn of the light-emitting layer 20G shown in row (iii) and column B includes a plurality of quantum dots that emit red light if not made non-light-emitting, but are made non-light-emitting and have the semiconductor conductivity type made n-type. The second layer 24Rp of the light-emitting layer 20B shown in row (iii) and column C includes a plurality of quantum dots that emit red light if not made non-light-emitting, but are made non-light-emitting and have the semiconductor conductivity type made p-type.

The third layer 25Bn of the light-emitting layer 20R shown in row (iii) and column A includes a plurality of quantum dots that emit blue light if not made non-light-emitting, but are made non-light-emitting and have the semiconductor conductivity type made n-type. The third layer 25Bn of the light-emitting layer 20G shown in row (iii) and column B includes a plurality of quantum dots that emit blue light if not made non-light-emitting, but are made non-light-emitting and have the semiconductor conductivity type made n-type. The third layer 25B of the light-emitting layer 20B shown in row (iii) and column C includes a plurality of quantum dots that emit blue light and are not made non-light-emitting.

For example, in FIG. 10 showing the direct structure, the first layer 23Gp of the light-emitting layer 20R shown in row (iv) and column A includes a plurality of quantum dots that emit green light if not made non-light-emitting, but are made non-light-emitting and have the semiconductor conductivity type made p-type. The first layer 23G of the light-emitting layer 20G shown in row (iv) and column B includes a plurality of quantum dots that emit green light and are not made non-light-emitting. The first layer 23Gp of the light-emitting layer 20B shown in row (iv) and column C includes a plurality of quantum dots that emit green light if not made non-light-emitting, but are made non-light-emitting and have the semiconductor conductivity type made p-type.

The second layer 24Bp of the light-emitting layer 20R shown in row (iv) and column A includes a plurality of quantum dots that emit blue light if not made non-light-emitting, but are made non-light-emitting and have the semiconductor conductivity type made p-type. The second layer 24Bn of the light-emitting layer 20G shown in row (iv) and column B includes a plurality of quantum dots that emit blue light if not made non-light-emitting, but are made non-light-emitting and have the semiconductor conductivity type made n-type. The second layer 24B of the light-emitting layer 20B shown in row (iv) and column C includes a plurality of quantum dots that emit blue light and are not made non-light-emitting.

The third layer 25R of the light-emitting layer 20R shown in row (iv) and column A includes a plurality of quantum dots that emit red light and are not made non-light-emitting. The third layer 25Rn of the light-emitting layer 20G shown in row (iv) and column B includes a plurality of quantum dots that emit red light if not made non-light-emitting, but are made non-light-emitting and have the semiconductor conductivity type made n-type. The third layer 25Rn of the light-emitting layer 20B shown in row (iv) and column C includes a plurality of quantum dots that emit red light if not made non-light-emitting, but are made non-light-emitting and have the semiconductor conductivity type made n-type.

For example, in FIG. 11 showing the inverted structure, the first layer 23R of the light-emitting layer 20R shown in row (vii) and column D includes a plurality of quantum dots that emit red light and are not made non-light-emitting. The first layer 23Rn of the light-emitting layer 20G shown in row (vii) and column E includes a plurality of quantum dots that emit red light if not made non-light-emitting, but are made non-light-emitting and have the semiconductor conductivity type made n-type. The first layer 23Rn of the light-emitting layer 20B shown in row (vii) and column F includes a plurality of quantum dots that emit red light if not made non-light-emitting, but are made non-light-emitting and have the semiconductor conductivity type made n-type.

The second layer 24Gp of the light-emitting layer 20R shown in row (vii) and column D includes a plurality of quantum dots that emit green light if not made non-light-emitting, but are made non-light-emitting and have the semiconductor conductivity type made p-type. The second layer 24G of the light-emitting layer 20G shown in row (vii) and column E includes a plurality of quantum dots that emit green light and are not made non-light-emitting. The second layer 24Gn of the light-emitting layer 20B shown in row (vii) and column F includes a plurality of quantum dots that emit green light if not made non-light-emitting, but are made non-light-emitting and have the semiconductor conductivity type made n-type.

The third layer 25Bp of the light-emitting layer 20R shown in row (vii) and column D includes a plurality of quantum dots that emit blue light if not made non-light-emitting, but are made non-light-emitting and have the semiconductor conductivity type made p-type. The third layer 25Bp of the light-emitting layer 20G shown in row (vii) and column E includes a plurality of quantum dots that emit blue light if not made non-light-emitting, but are made non-light-emitting and have the semiconductor conductivity type made p-type. The third layer 25B of the light-emitting layer 20B shown in row (vii) and column F includes a plurality of quantum dots that emit blue light and are not made non-light-emitting.

For example, in FIG. 11 showing the inverted structure, the first layer 23R of the light-emitting layer 20R shown in row (viii) and column D includes a plurality of quantum dots that emit red light and are not made non-light-emitting. The first layer 23Rn of the light-emitting layer 20G shown in row (viii) and column E includes a plurality of quantum dots that emit red light if not made non-light-emitting, but are made non-light-emitting and have the semiconductor conductivity type made n-type. The first layer 23Rn of the light-emitting layer 20B shown in row (viii) and column F includes a plurality of quantum dots that emit red light if not made non-light-emitting, but are made non-light-emitting and have the semiconductor conductivity type made n-type.

The second layer 24Bp of the light-emitting layer 20R shown in row (viii) and column D includes a plurality of quantum dots that emit blue light if not made non-light-emitting, but are made non-light-emitting and have the semiconductor conductivity type made p-type. The second layer 24Bn of the light-emitting layer 20G shown in row (viii) and column E includes a plurality of quantum dots that emit blue light if not made non-light-emitting, but are made non-light-emitting and have the semiconductor conductivity type made n-type. The second layer 24B of the light-emitting layer 20B shown in row (viii) and column F includes a plurality of quantum dots that emit blue light and are not made non-light-emitting.

The third layer 25Gp of the light-emitting layer 20R shown in row (viii) and column D includes a plurality of quantum dots that emit green light if not made non-light-emitting, but are made non-light-emitting and have the semiconductor conductivity type made p-type. The third layer 25G of the light-emitting layer 20G shown in row (viii) and column E includes a plurality of quantum dots that emit green light and are not made non-light-emitting. The third layer 25Gp of the light-emitting layer 20B shown in row (viii) and column F includes a plurality of quantum dots that emit green light if not made non-light-emitting, but are made non-light-emitting and have the semiconductor conductivity type made p-type.

In FIG. 10 and FIG. 11, the degree of injection efficiency of carriers (electrons and holes) to be injected into the light-emitting layer is indicated by the symbol "double circle" (injection efficiency is good), "○" (injection efficiency is good, following the symbol "double circle"), and "Δ" (injection efficiency is good, following ○) in the "INJECTION" column in order from a case where the injection efficiency is good to a case where the injection efficiency is bad.

In FIG. 10 and FIG. 11, in the first, second, and third layers forming the light-emitting layers 20R, 20G, and 20B, a degree of difficulty of absorption of light emitted from the light-emitting layer by another layer is indicated by the symbol "double circle" (light absorption is difficult), "○" (light absorption is difficult, following the symbol "double circle"), and "Δ" (light absorption is difficult, following ○) in the "LIGHT ABSORPTION" column in order from a case where light absorption is difficult to a case where light absorption is easy.

If the conductivity type of the quantum dots included in the layer made non-light-emitting among the first layer, the second layer, and the third layer of each of the light-emitting layers 20R, 20G, and 20B is matched with the disposed positions of the cathode 21 and the anode 27, all 36 combinations of the first layer, the second layer, and the third layer of each of the light-emitting layers 20R, 20G, and 20B can be adopted.

However, in consideration of the ease of injection of electrons and holes into the light-emitting layer among the first layer, the second layer, and the third layer and the degree of light absorption, several variations of combinations of the first layer, the second layer, and the third layer that are more suitable can be selected.

Here, whether light absorption is difficult can be determined based on the layering position of the light-emitting layer among the first layer, the second layer, and the third layer and the light extraction direction.

For example, in a case where the first layer, the second layer, and the third layer forming the light-emitting layer are layered in such a manner that the layer emitting red light, the layer emitting green light, and the layer emitting blue light are layered in this order from the lower layer (the layer farther from the light extraction side) to the upper layer (the layer closer to the light extraction side) and light is extracted to the outside of the light-emitting device through the electrode on the upper layer, an energy of the red light emitted from the lower layer that emits red light is smaller than the band gap of the quantum dots included in each of the layer that emits green light and the layer that emits blue light, which are above the layer that emits red light. Thus, the red light can be extracted to the outside of the light-emitting device without being substantially absorbed by the quantum dots included in each of the layer that emits green light and the layer that emits blue light. According to this layering order, green light emitted from the layer that emits green light can also be extracted to the outside of the light-emitting device without being substantially absorbed by the quantum dots included in the layer that emits blue light, which is layered on the layer that emits green light.

However, reversely, for example, in a case where the first layer, the second layer, and the third layer forming the light-emitting layer are layered in such a manner that the layer emitting blue light, the layer emitting green light, and the layer emitting red light are layered in this order from the lower layer (the layer farther from the light extraction side) to the upper layer (the layer closer to the light extraction side) and light is extracted to the outside of the light-emitting devices through the electrode on the upper layer, an energy of the blue light emitted from the lower layer that emits blue light may be slightly absorbed by the quantum dots included in each of the layer that emits green light and the layer that emits red light, which are above the layer that emits blue light, and so an amount of light extracted to the outside of the light-emitting devices may be slightly reduced.

Thus, as shown in FIG. 10, for example, according to the layered structure of the light-emitting layer 20R, the light-emitting layer 20G, and the light-emitting layer 20B shown in each of columns A to C of row (i), the light absorption is all the symbol "double circle". For example, the light absorption of the light-emitting layer 20R shown in row (ii) and column A is the symbol "double circle", the light absorption of the light-emitting layer 20G shown in row (ii) and column B is the symbol "double circle", and the light absorption of the light-emitting layer 20B shown in row (ii) and column C is "○". For example, the light absorption of the light-emitting layer 20R shown in row (iii) and column A is the symbol "double circle", the light absorption of the light-emitting layer 20G shown in row (iii) and column B is "○", and the light absorption of the light-emitting layer 20B shown in row (iii) and column C is the symbol "double circle". For example, the light absorption of the light-emitting layer 20R shown in row (iv) and column A is the symbol "double circle", the light absorption of the light-emitting layer 20G shown in row (iv) and column B is "○", and the light absorption of the light-emitting layer 20B shown in row (iv) and column C is "○".

As described above, from the results shown in FIG. 10, in the direct structure, the light-emitting layers 20R, 20G, and 20B having the layered structure of any one of the following Pattern 1 to Pattern 4 can suppress light absorption, making it possible to efficiently extract emitted light to the outside of the light-emitting devices 3R, 3G, and 3B.

Pattern 1

As shown in row (i) and columns A to C, the layer including quantum dots that emit red light if not made non-light-emitting is the first layer, the layer including quantum dots that emit green light if not made non-light-emitting is the second layer, and the layer including quantum dots that emit blue light if not made non-light-emitting is the third layer.

Pattern 2

As shown in row (ii) and columns A to C, the layer including quantum dots that emit red light if not made non-light-emitting is the first layer, the layer including quantum dots that emit blue light if not made non-light-emitting is the second layer, and the layer including quantum dots that emit green light if not made non-light-emitting is the third layer.

Pattern 3

As shown in row (iii) and columns A to C, the layer including quantum dots that emit green light if not made non-light-emitting is the first layer, the layer including quantum dots that emit red light if not made non-light-emitting is the second layer, and the layer including quantum dots that emit blue light if not made non-light-emitting is the third layer.

Pattern 4

As shown in row (iv) and columns A to C, the layer including quantum dots that emit green light if not made non-light-emitting is the first layer, the layer including quantum dots that emit blue light if not made non-lightemitting is the second layer, and the layer including quantum dots that emit red light if not made non-light-emitting is the third layer.

Furthermore, as shown in FIG. 11, for example, according to the layered structure of the light-emitting layer 20R, the light-emitting layer 20G, and the light-emitting layer 20B shown in each of columns D to F of row (vii), the light absorption is all the symbol "double circle". For example, the light absorption of the light-emitting layer 20R shown in row (viii) and column D is the symbol "double circle", the light absorption of the light-emitting layer 20G shown in row (viii) and column E is the symbol "double circle", and the light absorption of the light-emitting layer 20B shown in row (viii) and column F is "○".

As described above, from the results shown in FIG. 11, in the inverted structure, the light-emitting layers 20R, 20G, and 20B having the layered structure of either one of the following Pattern 5 and Pattern 6 can suppress light absorption, making it possible to efficiently extract emitted light to the outside of the light-emitting devices 3R, 3G, and 3B.

Pattern 5

As shown in row (vii) and columns D to F, the layer including quantum dots that emit red light if not made non-light-emitting is the first layer, the layer including quantum dots that emit green light if not made non-light-emitting is the second layer, and the layer including quantum dots that emit blue light if not made non-light-emitting is the third layer.

Pattern 6

As shown in row (viii) and columns D to F, the layer including quantum dots that emit red light if not made non-light-emitting is the first layer, the layer including quantum dots that emit blue light if not made non-light-emitting is the second layer, and the layer including quantum dots that emit green light if not made non-light-emitting is the third layer.

Figure 12:
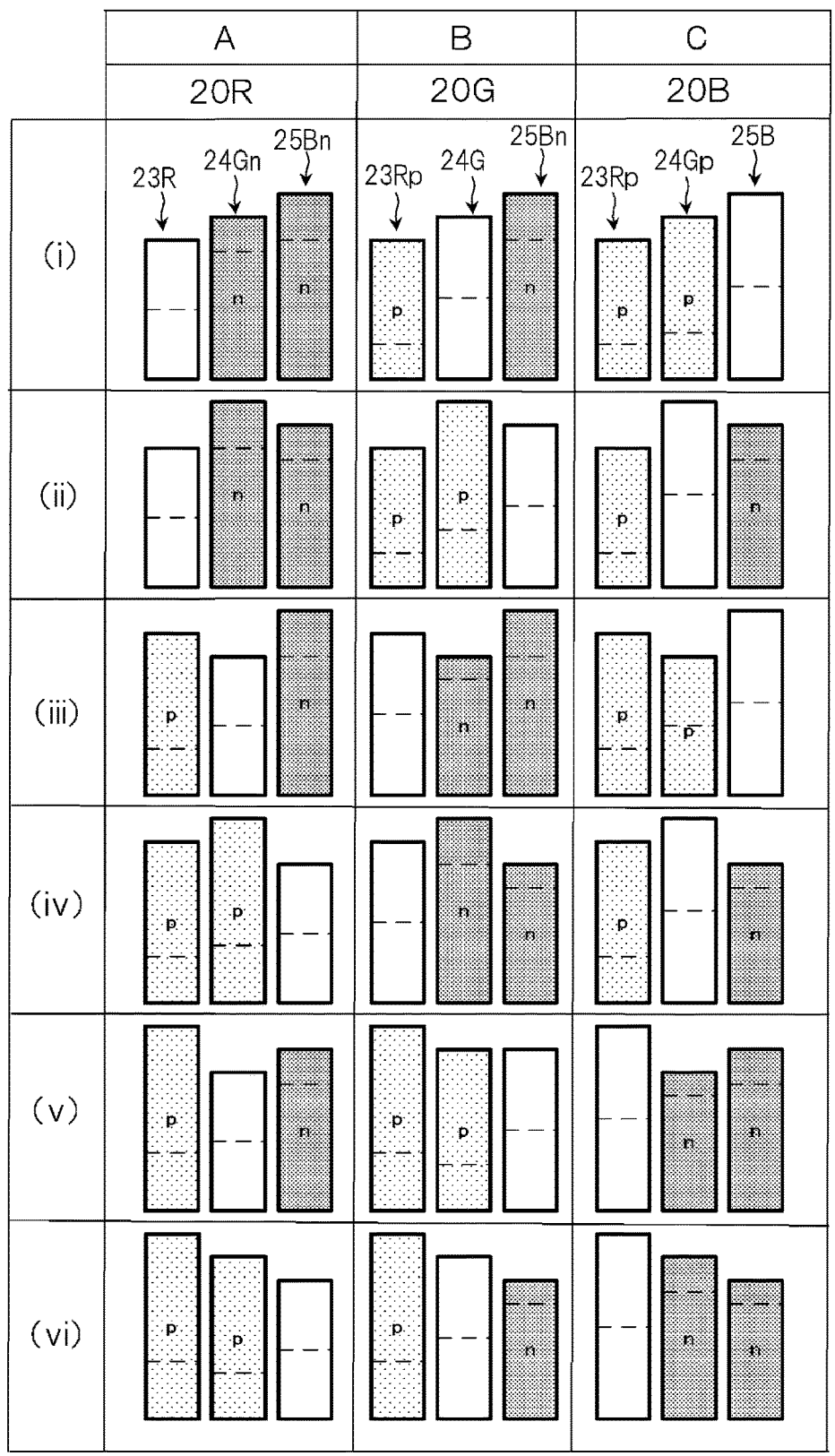
FIG. 12 is a diagram showing an energy band in a state where the first layer, the second layer, and the third layer forming each light-emitting layer shown in FIG. 10 are isolated.
Figure 13:
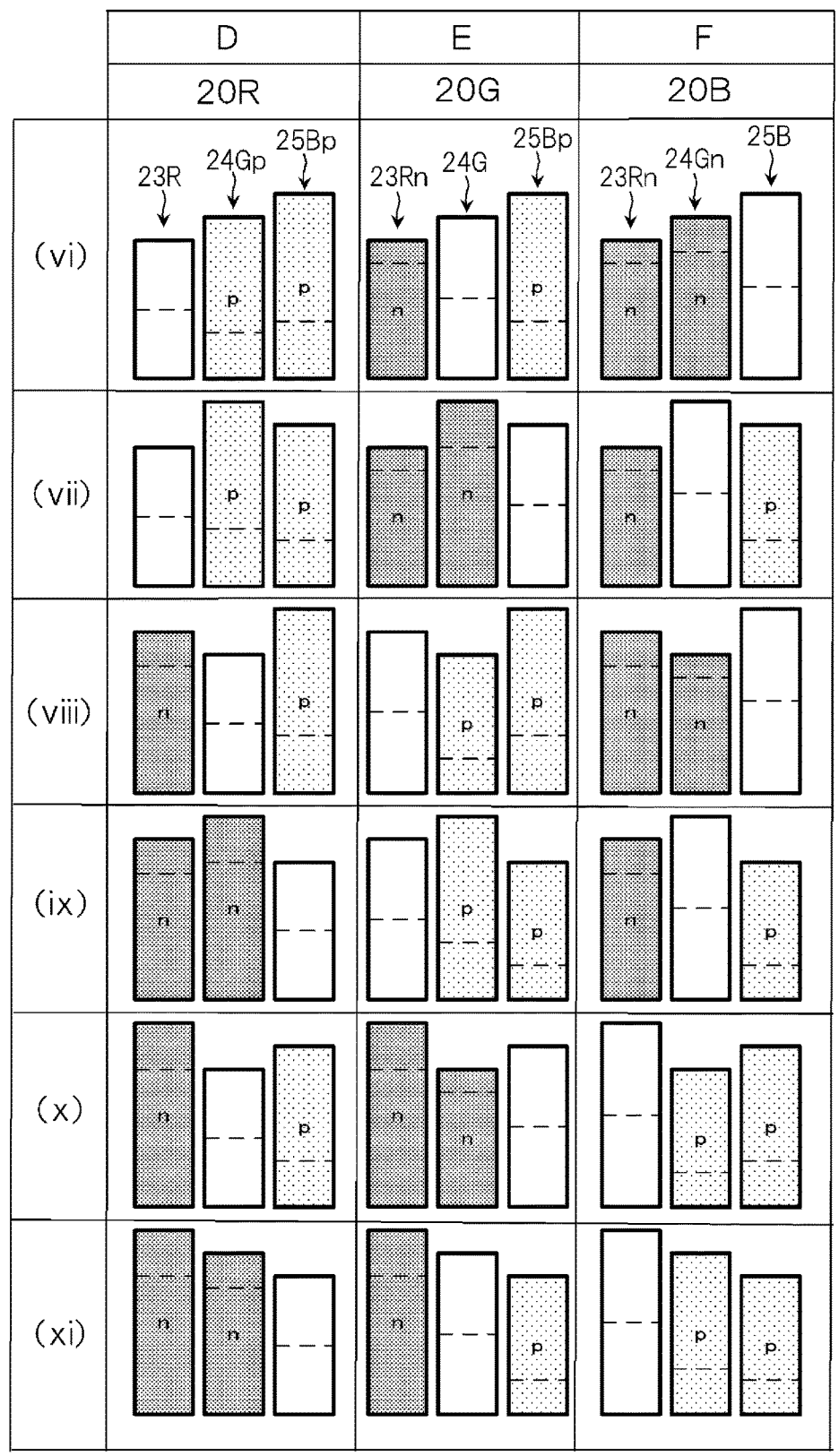
FIG. 13 is a diagram showing an energy band in a state where the first layer, the second layer, and the third layer forming each light-emitting layer shown in FIG. 11 are isolated.

FIG. 12 is a diagram showing an energy band in a state where the first layer, the second layer, and the third layer forming each of the light-emitting layers 20R, 20G, and 20B shown in FIG. 10 are isolated. FIG. 13 is a diagram showing an energy band in a state in which the first layer, the second layer, and the third layer forming each of the light-emitting layers 20R, 20G, and 20B shown in FIG. 11 are isolated.

FIG. 12 and FIG. 13 show an energy band of each of the first layer, the second layer, and the third layer in a state where the first layer, the second layer, and the third layer are not joined to each other. In each energy band, the upper end represents a conduction band minimum (CBM), the lower end represents a valence band maximum (VBM), and the dashed line represents a Fermi level.

In FIG. 12, energy bands of the first layer, the second layer, and the third layer in the light-emitting layers 20R, 20G, and 20B in the respective rows and columns in FIG. 10 are arranged from left to right in the drawing for the respective rows and columns. In FIG. 13, energy bands of the first layer, the second layer, and the third layer in the light-emitting layers 20R, 20G, and 20B of the respective rows and columns in FIG. 11 are arranged from left to right in the drawing for the respective rows and columns.

For example, in row (i) and column A of FIG. 12, energy bands of the first layer 23R, the second layer 24Gn, and the third layer 25Bn of the light-emitting layer 20R shown in row (i) and column A of FIG. 10 are arranged from left to right in the drawing. For example, in row (i) and column B of FIG. 12, energy bands of the first layer 23Rp, the second layer 24G, and the third layer 25Bn of the light-emitting layer 20G shown in row (i) and column B of FIG. 10 are arranged from left to right in the drawing. For example, in row (i) and column C of FIG. 12, energy bands of the first layer 23Rp, the second layer 24G, and the third layer 25Bn of the light-emitting layer 20G shown in row (i) and column B of FIG. 10 are arranged from left to right in the drawing. Similarly, the other rows and columns in FIG. 12 each show energy bands of the first layer, the second layer, and the third layer forming the light-emitting layer shown in the corresponding row and column in FIG. 10.

For example, in row (vi) and column D of FIG. 13, energy bands of the first layer 23R, the second layer 24Gp, and the third layer 25Bp of the light-emitting layer 20R shown in row (vi) and column D of FIG. 11 are arranged from left to right in the drawing. For example, in row (vi) and column E of FIG. 13, energy bands of the first layer 23Rn, the second layer 24G, and the third layer 25Bp of the light-emitting layer 20G shown in row (vi) and column E of FIG. 11 are arranged from left to right in the drawing. For example, in row (vi) and column F of FIG. 13, energy bands of the first layer 23Rn, the second layer 24Gn, and the third layer 25B of the light-emitting layer 20B shown in row (vi) and column F of FIG. 11 are arranged from left to right in the drawing. Similarly, the other rows and columns in FIG. 13 each show energy bands of the first layer, the second layer, and the third layer forming the light-emitting layer shown in the corresponding row and column in FIG. 11.

Figure 14:
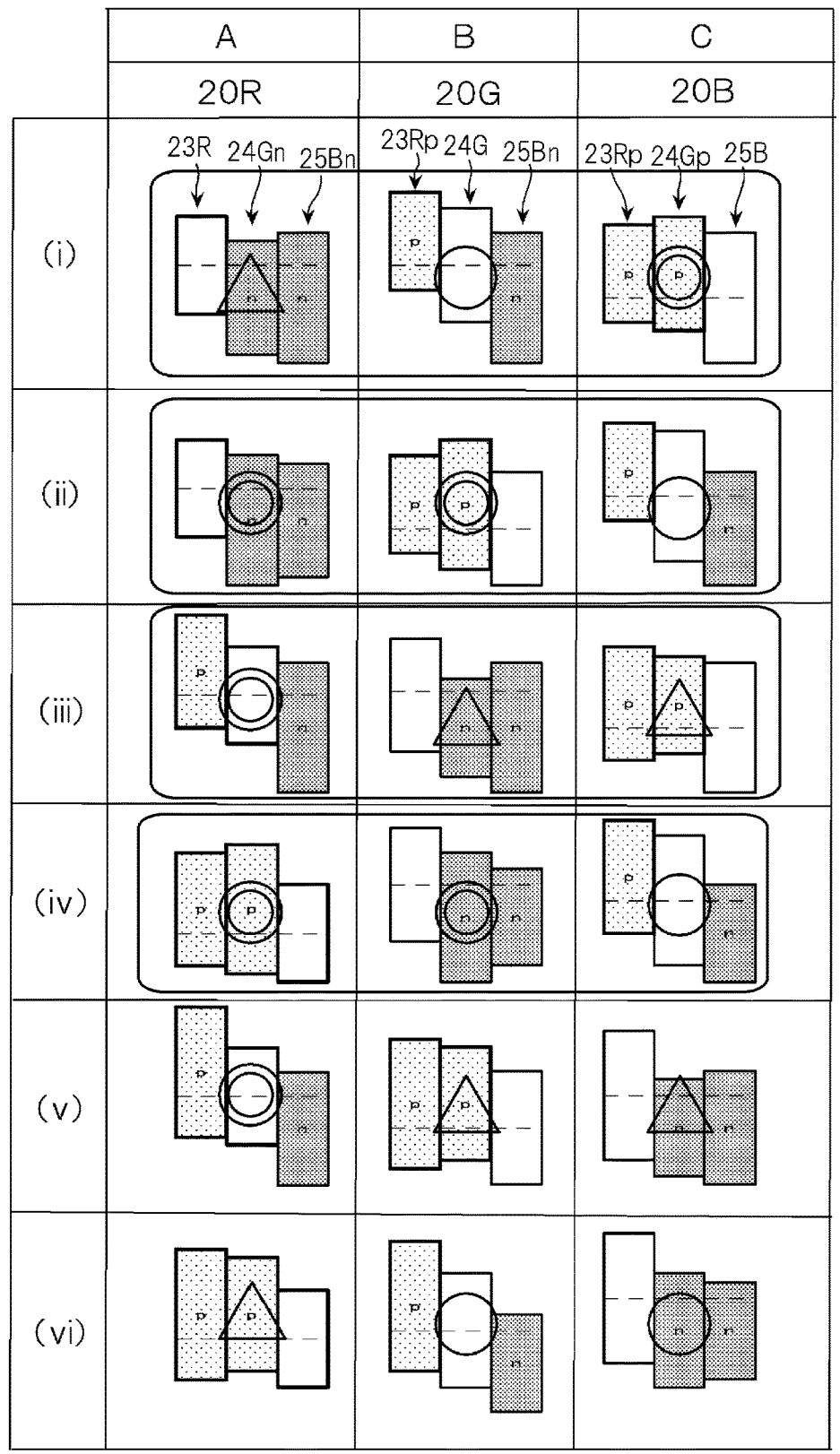
FIG. 14 is a diagram showing an energy band in a state where the first layer, the second layer, and the third layer forming each light-emitting layer shown in FIG. 12 are joined.
Figure 15:
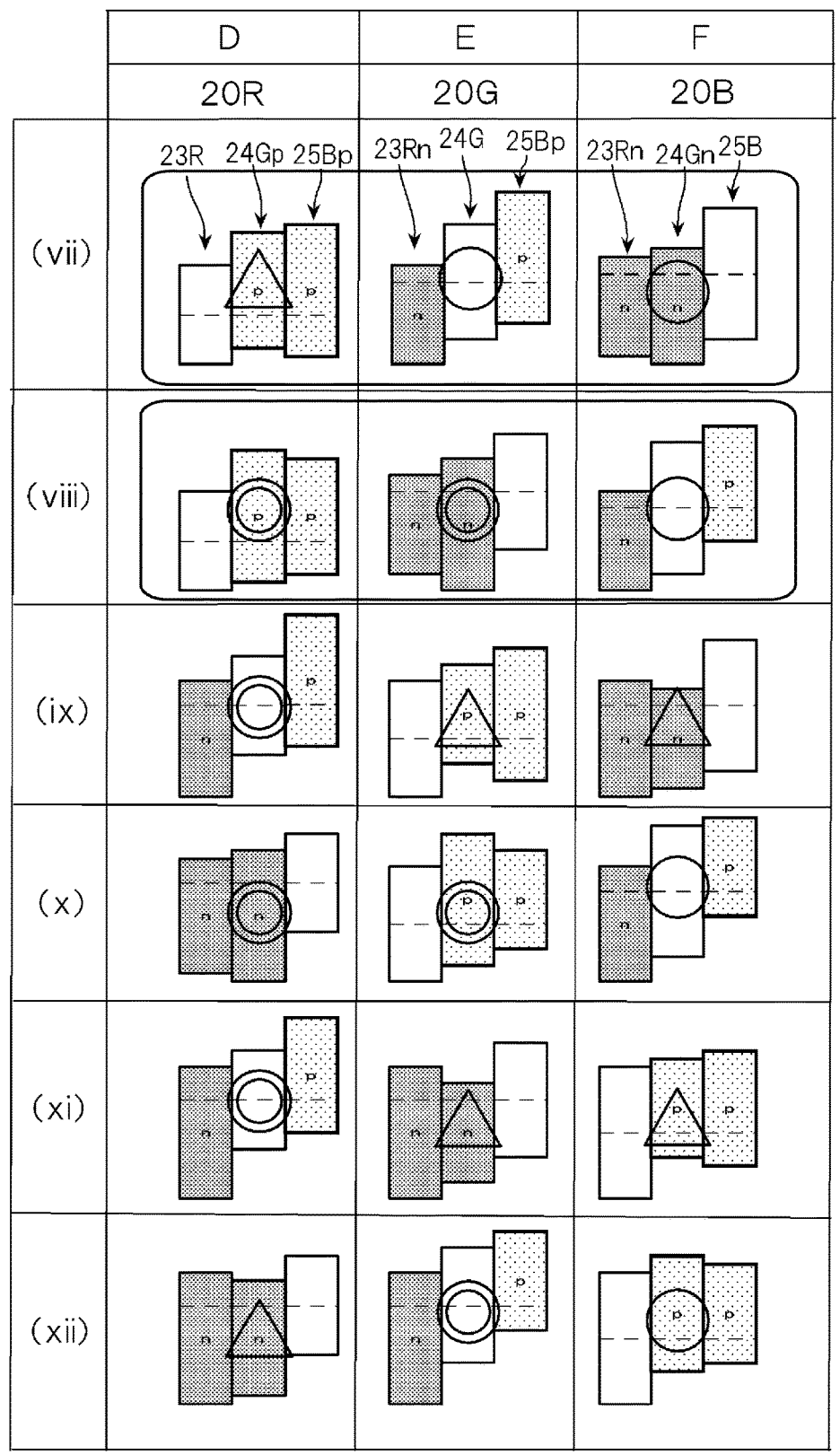
FIG. 15 is a diagram showing an energy band in a state where the first layer, the second layer, and the third layer forming each light-emitting layer shown in FIG. 13 are joined.

FIG. 14 is a diagram showing energy bands in a state where the first layer, the second layer, and the third layer forming each of the light-emitting layers 20R, 20G, and 20B shown in FIG. 12 are joined to each other. FIG. 15 is a diagram showing energy bands in a state where the first layer, the second layer, and the third layer forming each of the light-emitting layers 20R, 20G, and 20B shown in FIG. 13 are joined to each other. Note that in FIG. 14, the symbol "double circle", "○", and "Δ" shown in the "INJECTION" column for each row and column in FIG. 10, are shown for each row and column. In FIG. 15, the symbol "double circle", "○", and "Δ" shown in the "INJECTION" column for each row and column in FIG. 11, are shown for each row and column.

As shown in FIG. 14 and FIG. 15, when the first layer, the second layer, and the third layer are joined to each other, the energy bands of the first layer, the second layer, and the third layer have the same Fermi level due to thermal equilibrium. As a result, the conduction band and the valence band of each energy band are shifted.

A more suitable structure for the carrier injection efficiency can be determined based on two criteria, which are the height of an injection barrier when electrons and holes are injected into a light-emitting layer among the first layer, the second layer, and the third layer forming each of the light-emitting layers 20R, 20G, and 20B, and whether a potential well is formed at an interface between the light-emitting layer and an adjacent layer. A lower injection barrier is more suitable, and a structure in which no potential well is formed is more suitable.

When the carrier injection was studied based on the above criteria, a result consistent with the layering order suitable for light extraction was obtained.

That is, as shown in FIG. 10 and FIG. 14, in the case where the light-emitting devices 3R, 3G, and 3B have the direct structure, the combinations of row (ii) and columns A to C and the combinations of row (iv) and columns A to C have the best carrier injection efficiency, and the combinations of row (i) and columns A to C and the combinations of row (iii) and columns A to C have the second best carrier injection efficiency.

The first layer, the second layer, and the third layer forming each of the light-emitting layers 20R, 20G, and 20B according to the present embodiment include quantum dots. One of the layers is a light-emitting layer, and the quantum dots included in the layers other than the light-emitting layer are made non-light-emitting, and have the semiconductor conductivity type made n-type or p-type. Thus, a barrier for confining electrons or holes can be formed in each of the first layer, the second layer, and the third layer forming each of the light-emitting layers 20R, 20G, and 20B.

In particular, it is shown that a high barrier can be formed in layers on both sides or in a layer on one side of the light-emitting layer, in the case of the direct structure as shown in row (ii) and columns A to C and row (iv) and columns A to C in FIG. 14 and also in the case of the inverted structure as shown in column (viii) and columns D to F in FIG. 15.

This barrier indicates that electrons or holes injected into the layer to emit light from the opposite electrode through the light-emitting layer are effectively confined in the layer. The barrier for confining electrons and holes is also formed by a CBM difference, a VBM difference, and a Fermi level difference between the electron transport layer 22 and the hole transport layer 26 sandwiching each of the light-emitting layers 20R, 20G, and 20B. However, according to the configuration of the light-emitting layers 20R, 20G, and 20B of the present embodiment, in addition to the above-described barrier, carriers can be doubly confined in a narrow region of each of the light-emitting layers 20R, 20G, and 20B, so that it is possible to enhance a recombination efficiency of carriers.

Example

Here, a layer including quantum dots was formed having a thickness of 40 nm and inserted into a chamber of a plasma treatment apparatus. Then, discharge electrodes were set to 50 W, a mixed gas of Ar and $Cl_2$ was supplied into the chamber to generate $Cl_2$ plasma, and plasma irradiation was performed for 20 seconds, and so the quantum dots 33R included in the first layer 23R were made non-light-emitting, and at the same time, an n-type conductivity type was obtained.

When another experiment for evaluating the electrical characteristics of the layer including the quantum dots made n-type was conducted, the quantum dots made n-type had an electron density of about $10^{16}$ cm$^{-3}$ and a mobility of about 10 cm$^2$/V·sec. At this time, for evaluation, the layer including quantum dots was made non-light-emitting by performing application and plasma treatment multiple times, and adjusted to have a thickness of about 500 nm. With the above-described procedure, the first layer, the second layer, and the third layer forming each of the light-emitting layers 20R, 20G, and 20B can be formed.

In the case of obtaining the p-type conductivity type, similarly to the case of obtaining the n-type conductivity type, a layer including quantum dots was formed having a predetermined thickness, and plasma treatment was performed. Then, when the electrical characteristics were confirmed in another experiment, the hole concentration was from $7 \times 10^{15}$ cm$^{-3}$ to $7 \times 10^{16}$ cm$^{-3}$, and the mobility was 1 cm$^2$/V·sec or less. In general, holes in semiconductors have a large effective mass and lower mobility than electrons, and the same tendency is markedly seen particularly in wide gap materials such as Group II-VI compounds. As for the hole concentration, since the impurity levels of nitrogen and oxygen, which are acceptors, are deeper than an energy corresponding to room temperature, it is known that the hole concentration is lower than the electron concentration by an order of magnitude, as the carrier concentration, and so the same tendency was obtained.

First Modified Example

Figure 16:
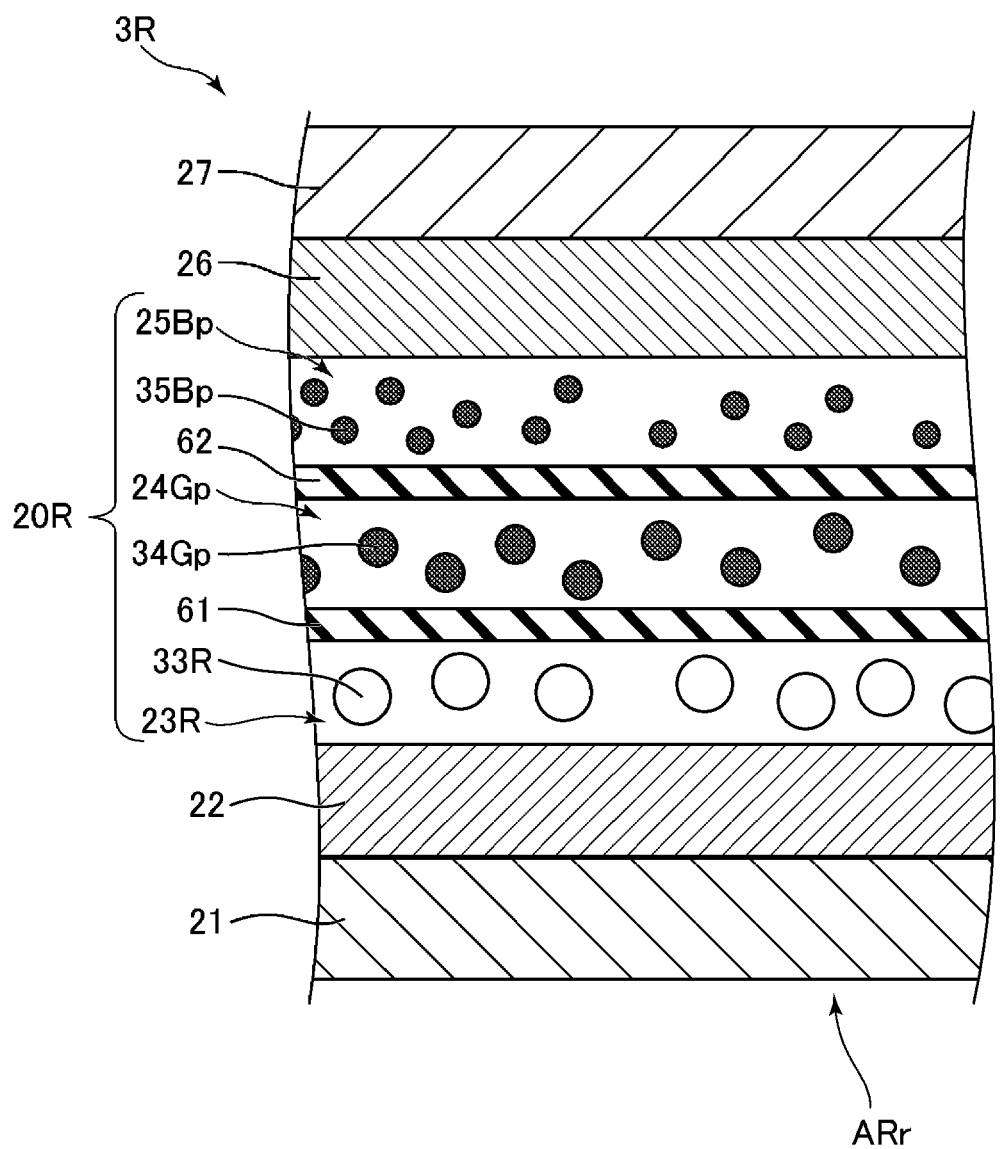
FIG. 16 is a cross-sectional view schematically illustrating a light-emitting device that emits red light, included in a display device according to a first modified example.
Figure 17:
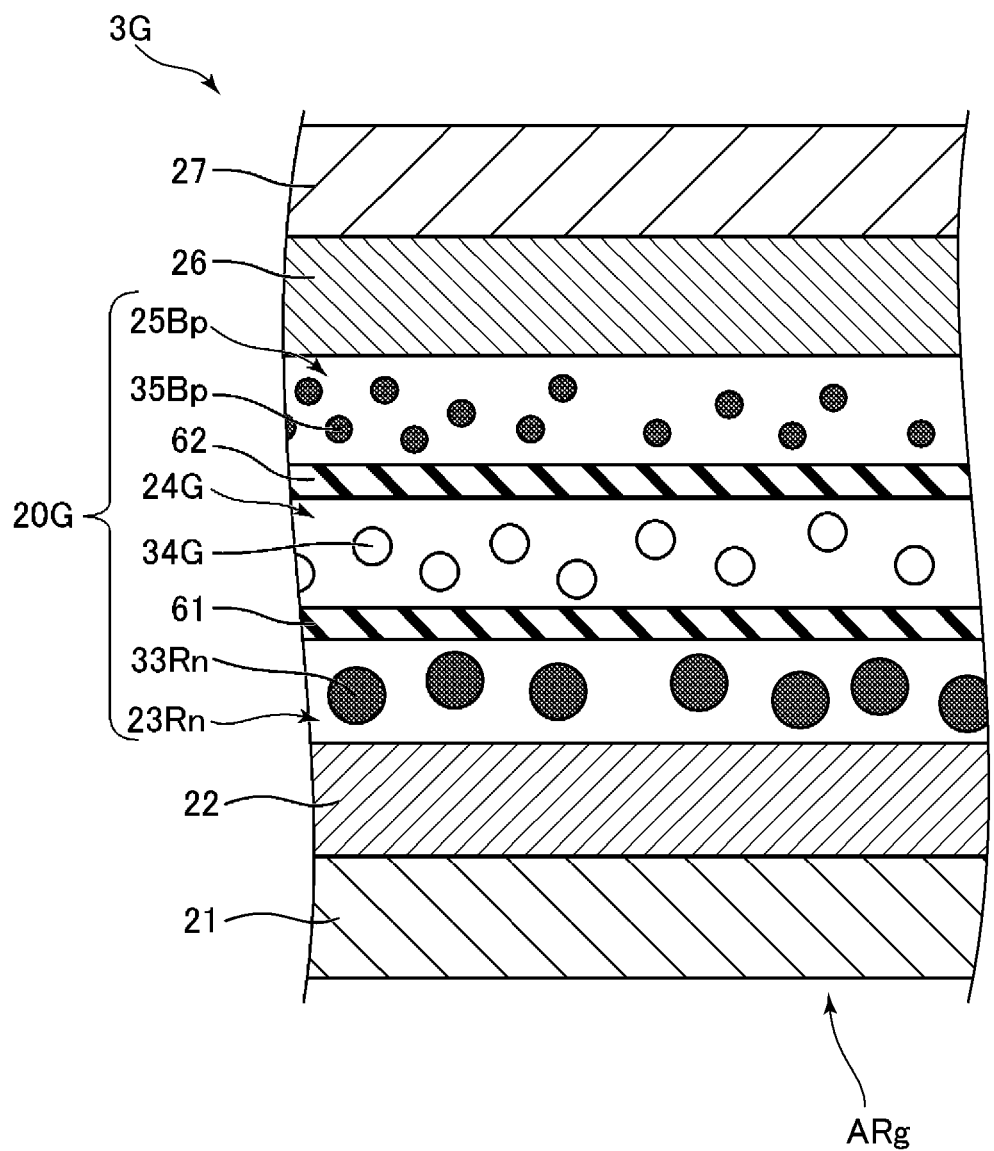
FIG. 17 is a cross-sectional view schematically illustrating a light-emitting device that emits green light, included in the display device according to the first modified example.
Figure 18:
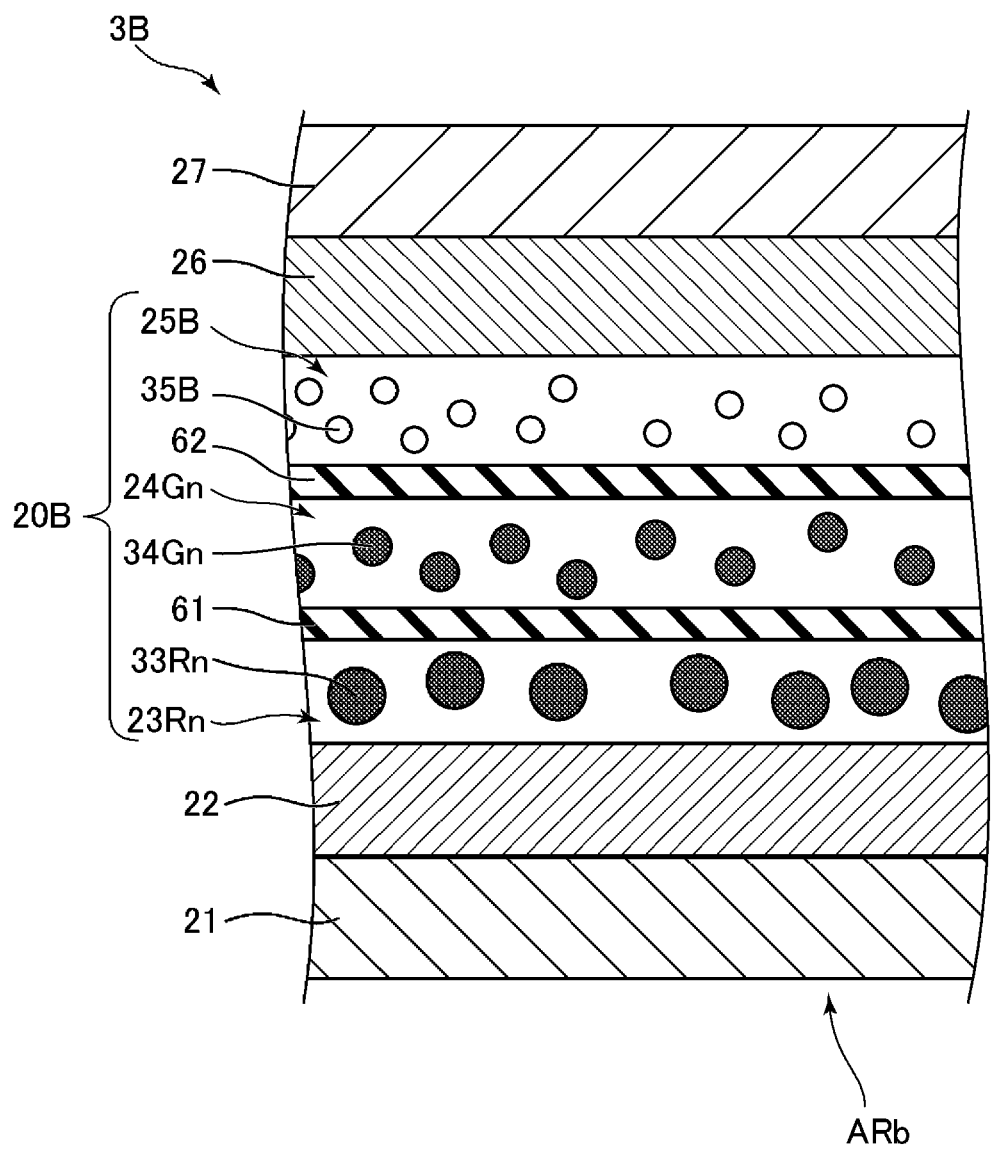
FIG. 18 is a cross-sectional view schematically illustrating a light-emitting device that emits blue light, included in the display device according to the first modified example.

Light-emitting devices 3R, 3G, and 3B included in a display device 1 according to a first modified example of the embodiment will be described with reference to FIGS. 16 to 19. FIG. 16 is a cross-sectional view schematically illustrating the light-emitting device 3R included in the display device 1 according to the first modified example. FIG. 17 is a cross-sectional view schematically illustrating the light-emitting device 3G included in the display device 1 according to the first modified example. FIG. 18 is a cross-sectional view schematically illustrating the light-emitting device 3B included in the display device 1 according to the first modified example.

As illustrated in FIG. 16, the light-emitting layer 20R included in the light-emitting device 3R may include a first protection layer 61 provided between the first layer 23R and the second layer 24Gp, and may include a second protection layer 62 provided between the second layer 24Gp and the third layer 25Bp.

As illustrated in FIG. 17, the light-emitting layer 20G included in the light-emitting device 3G may include the first protection layer 61 provided between the first layer 23Rn and the second layer 24G, and may include the second protection layer 62 provided between the second layer 24G and the third layer 25Bp.

As illustrated in FIG. 18, the light-emitting layer 20B included in the light-emitting device 3B may include the first protection layer 61 provided between the first layer 23Rn and the second layer 24Gn, and may include the second protection layer 62 provided between the second layer 24Gn and the third layer 25B.

As described above, the quantum dots being made non-light-emitting and control of the conductivity type (n-type or p-type) of the quantum dots in the light-emitting layers 20R, 20G, and 20B are performed by plasma treatment. For this reason, the thickness of a layer in which quantum dots are made non-light-emitting is determined by a depth by which charged particles forming plasma enter the layer to be made non-light-emitting and be subjected to control of the conductivity type.

However, in some cases, the depth by which charged particles forming plasma enter the layer to be made non-light-emitting and be subjected to control of the conductivity type cannot be controlled on the order of nm.

Thus, the first protection layer 61 for protecting the first layer 23R from the plasma treatment is provided at least between the first layer 23R which is a light-emitting layer and is not to be subjected to the plasma treatment and the second layer 24Gp to be subjected to the plasma treatment in the light-emitting layer 20R. With this configuration, in the step of making the second layer 24Gp non-light-emitting by the plasma treatment, it is possible to prevent the quantum dots 33R included in the first layer 23R as the lower layer from being subjected to the plasma treatment and made non-light-emitting.

In addition, the second protection layer 62 for protecting the second layer 24G from the plasma treatment is provided at least between the second layer 23G which is a light-emitting layer and is not to be subjected to the plasma treatment and the third layer 25Bp to be subjected to the plasma treatment in the light-emitting layer 20G. With this configuration, in the step of making the third layer 25B non-light-emitting by the plasma treatment, it is possible to prevent the quantum dots 34G included in the second layer 24G as the lower layer from being subjected to the plasma treatment and made non-light-emitting.

The first protection layer 61 and the second protection layer 62 each can be formed as a continuous layer on the entire display region by application or the like, for example.

Accordingly, for example, the first protection layer 61 between the first layer 23Rn and the second layer 24G in the light-emitting layer 20G illustrated in FIG. 16 and the first protection layer 61 between the first layer 23Rn and the second layer 24Gn in the light-emitting layer 20B illustrated in FIG. 17 need not be formed, but may be formed as a continuous layer on the entire display region by application or the like, depending on the manufacturing process. Furthermore, for example, the second protection layer 62 between the second layer 23Gp and the third layer 25Bp in the light-emitting layer 20R illustrated in FIG. 15 and the second protection layer 62 between the second layer 24Gn and the third layer 25B in the light-emitting layer 20B illustrated in FIG. 17 need not be formed, but may be formed as a continuous layer on the entire display region by application or the like, depending on the manufacturing process.

The first protection layer 61 and the second protection layer 62 may have, for example, a thickness of about 5 nm or less. It is necessary for the first protection layer 61 and the second protection layer 62 to transport electrons or holes, and thus it is preferable to set the upper limit of the thickness of each of the first protection layer 61 and the second protection layer 62 to 5 nm with which tunneling is capable. The lower limit of the thickness of each of the first protection layer 61 and the second protection layer 62 is about 2 nm with which the protection layers can protect the lower layer from plasma irradiation and can be formed as a continuous layer. Accordingly, the thickness of each of the first protection layer 61 and the second protection layer 62 is preferably 2 nm or more and 5 nm or less. This makes it possible to protect the lower layer sufficiently from the plasma treatment and transport electrons or holes.

The first protection layer 61 and the second protection layer 62 are formed using a material having plasma resistance to protect the lower layer from the plasma treatment. Examples of the material having plasma resistance include resin materials such as polyvinyl chloride (PVC), polyvinylpyrrolidone (PVP), and (p-)triphenyldiamine (TPD).

Figure 19:
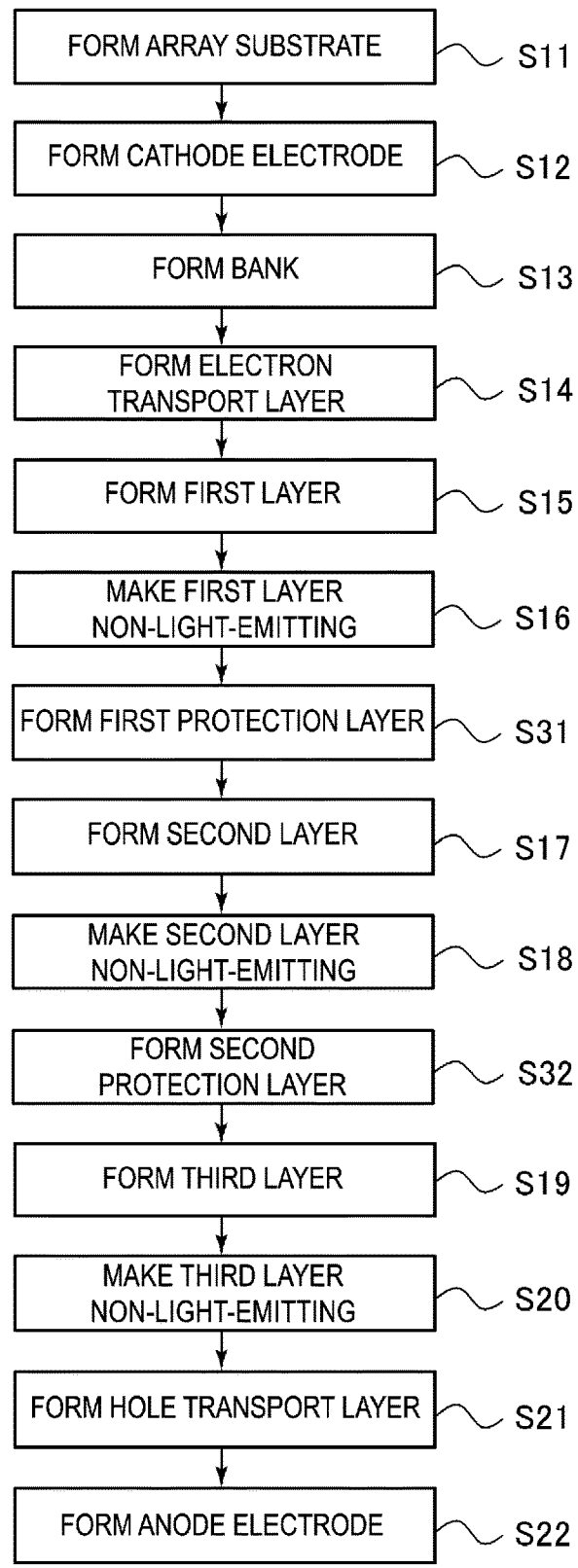
FIG. 19 is a flowchart illustrating a process of manufacturing the display device according to the first modified example.

FIG. 19 is a flowchart illustrating a process of manufacturing the display device 1 according to the first modified example. The flowchart shown in FIG. 19 is the same as the flowchart shown in FIG. 2 except that step S31 of forming a first protection layer and step S32 of forming a second protection layer are added to the flowchart shown in FIG. 2. With reference to FIGS. 16 to 19, the method for manufacturing the display device according to the first modified example will be described.

Proceeding from step S11 to step S16, after step S16 of making the first layer 33Rn of each of the light-emitting device formation region ARg and the light-emitting device formation region ARb non-light-emitting and before step S17 of forming the second layer 24G, the first protection layer 61 having plasma resistance is formed by, for example, application or the like, so as to be layered on each of the first layer 23R in the light-emitting device formation region ARr, the first layer 23Rn in the light-emitting device formation region ARg, and the first layer 23Rn in the light-emitting device formation region ARb (step S31).

Then, in the next step S17, the second layer 24G is formed on the first protection layer 61 in each of the light-emitting device formation regions ARr, ARg, and ARb.

Next, in step S18, the second layer 24G in the light-emitting device formation region ARb is made non-light-emitting by plasma treatment to form the second layer 24Gn, and the second layer 24G in the light-emitting device formation region ARr is made non-light-emitting by plasma treatment to form the second layer 24Gp.

Here, the first protection layer 61 having plasma resistance is formed at least on the first layer 23R in the light-emitting device formation region ARr, and thus, when the second layer 24G in the light-emitting device formation region ARr is made non-light-emitting by plasma treatment to form the second layer 24Gp, it is possible to prevent the quantum dots 33R included in the first layer 23R below the first protection layer 61 from being made non-light-emitting by the plasma treatment.

After the second layer 24G in the light-emitting device formation region ARb is made non-light-emitting by plasma treatment to form the second layer 24Gn, and the second layer 24G in the light-emitting device formation region ARr is made non-light-emitting by plasma treatment to form the second layer 24Gp in step S18, and before step S19 of forming the third layer 25B, the second protection layer 62 having plasma resistance is formed by, for example, application or the like, so as to be layered on each of the second layer 24Gp in the light-emitting device formation region ARr, the second layer 24G in the light-emitting device formation region ARg, and the second layer 24Gn in the light-emitting device formation region ARb (step S32).

Then, in the next step S19, the third layer 25B is formed on the second protection layer 62 in each of the light-emitting device formation regions ARr, ARg, and ARb.

Next, in step S20, the third layer 25B in the light-emitting device formation region ARr is made non-light-emitting to form the third layer 25Bp, and the third layer 25G in the light-emitting device formation region ARg is made non-light-emitting to form the third layer 25Bp.

Here, the second protection layer 62 having plasma resistance is formed at least on the second layer 24G in the light-emitting device formation region ARg, and thus, when the third layer 25B in the light-emitting device formation region ARg is made non-light-emitting by plasma treatment to form the third layer 25Bp, it is possible to prevent the quantum dots 34G included in the second layer 24G below the second protection layer 62 from being made non-light-emitting by the plasma treatment.

Thereafter, the display device 1 is completed through step S21 and step S22.

Second Modified Example

Figure 20:
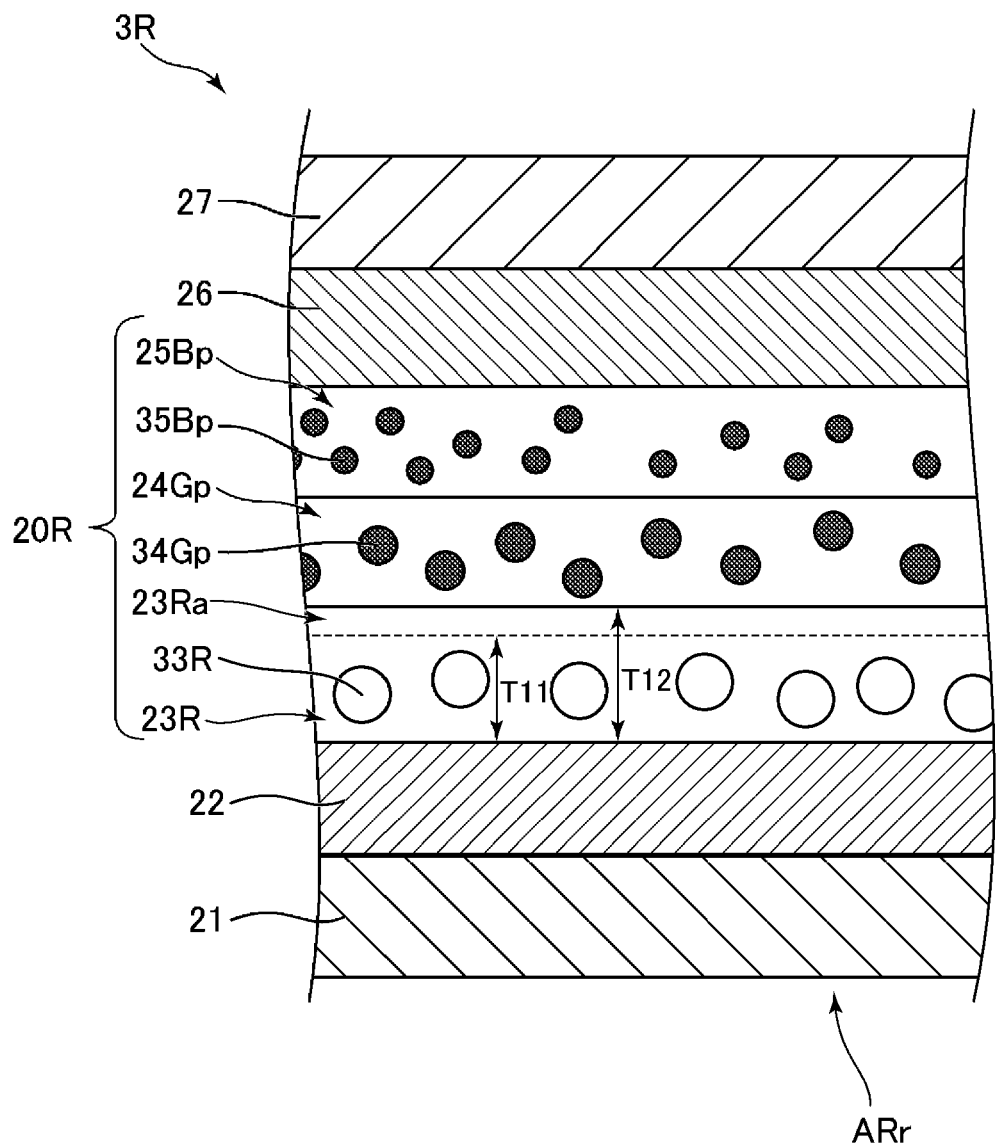
FIG. 20 is a cross-sectional view schematically illustrating a light-emitting device that emits red light, included in a display device according to a second modified example.
Figure 21:
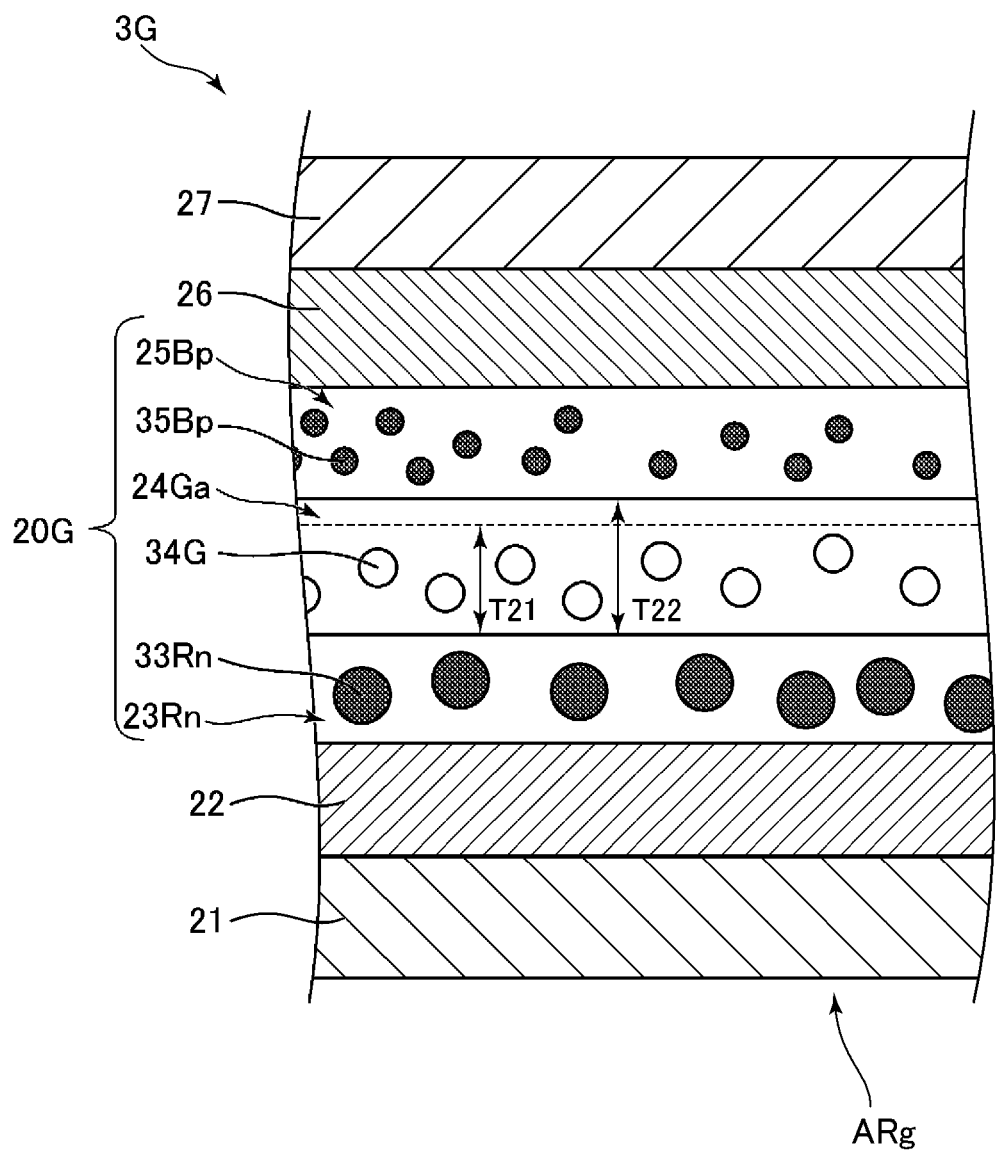
FIG. 21 is a cross-sectional view schematically illustrating a light-emitting device that emits green light, included in the display device according to the second modified example.

With reference to FIG. 20 and FIG. 21, light-emitting devices 3R and 3G included in a display device 1 according to a second modified example of the embodiment will be described. FIG. 20 is a cross-sectional view schematically illustrating the light-emitting device 3R included in the display device 1 according to the second modified example. FIG. 21 is a cross-sectional view schematically illustrating the light-emitting device 3G included in the display device 1 according to the second modified example. Note that the light-emitting device 3B included in the display device 1 according to the second modified example may have the same configuration as that of the light-emitting device 3B described with reference to FIG. 1 and the like.

As illustrated in FIG. 20, in the light-emitting layer 20R, the first layer 23R which is a light-emitting layer and is not subjected to plasma treatment may be formed having a thickness T12 that is larger than a predetermined design thickness T11. The light-emitting layer 20R only need be formed in such a manner that the thickness of the first layer 23R in the light-emitting device formation region ARr is larger than the predetermined design thickness T11 in step S15 of forming the first layer described in FIG. 2.

As a result, in the step of making the second layer 24Gp on the first layer 23R non-light-emitting by plasma treatment, a thick portion 23Ra of the first layer 23R serves as a sacrificial layer for charged particles that have passed through the second layer 24Gp being the upper layer and entered the thick portion 23Ra by the plasma treatment. This can cause the first layer 23R to more easily emit light with a brightness as designed.

Furthermore, as illustrated in FIG. 21, in the light-emitting layer 20G, the second layer 24G which is a light-emitting layer and is not subjected to plasma treatment may be formed having a thickness T22 that is larger than a predetermined design thickness T21. The light-emitting layer 20G only need be formed in such a manner that the thickness of the second layer 24G in the light-emitting device formation region ARg is larger than the predetermined design thickness T21 in step S17 of forming the second layer described in FIG. 2.

As a result, in the step of making the third layer 25Bp on the first layer 24G non-light-emitting by plasma treatment, a thick portion 24Ga of the second layer 24G serves as a sacrificial layer for charged particles that have passed through the third layer 25Bp being the upper layer and entered the thick portion 24Ga by the plasma treatment.

This can cause the second layer 24G to more easily emit light with a brightness as designed.

The thickness T12 relative to the design thickness T11 and the thickness T22 relative to the design thickness T21 are preferably about 1.2 times (from 1.1 times to 1.4 times) greater. When the thicknesses are intentionally increased by 20% from the design thicknesses T11 and T21, it is possible to absorb uncontrollable variations of irradiation conditions of the plasma treatment. That is, it is possible to cause the first layer 23R and the second layer 24G to more stably emit light with brightness as designed.

Here, the thick portion 23Ra and the thick portion 24Ga are preferably thicker than the first protection layer 61 and the second protection layer 62 illustrated in FIGS. 16 to 18, respectively. This is because the thick portion 23Ra is a part of the first layer 23R including the quantum dots 33R, and thus there are gaps between the quantum dots 33R, and the thick portion 24Ga is a part of the second layer 24G including the quantum dots 34G, and thus there are gaps between the quantum dots 34G. Accordingly, when the thicknesses of the thick portion 23Ra and the thick portion 24Ga are respectively made larger than those of the first protection layer 61 and the second protection layer 62 illustrated in FIGS. 16 to 18, it is possible to prevent charged particles at the time of plasma treatment from passing through the gaps between the quantum dots 33R or the gaps between the quantum dots 34G and entering.

On the other hand, the first protection layer 61 and the second protection layer 62 illustrated in FIGS. 16 to 18 are dense polymers that do not contain quantum dots. This makes it possible to more reliably suppress entry of the charged particles at the time of plasma treatment even when the first protection layer 61 and the second protection layer 62 have thicknesses thinner than those of the thick portion 23Ra and the thick portion 24Ga. As a result, even when the first protection layer 61 and the second protection layer 62 have thicknesses thinner than those of the thick portion 23Ra and the thick portion 24Ga, it is possible to more reliably protect the lower layer from the plasma treatment.

Note that the components described in the above-described embodiment and the modified examples may be appropriately combined in a range in which a contradiction does not arise.

The invention claimed is:

1. A display device, comprising:
   a first light-emitting device; and
   a second light-emitting device,
   wherein;
   each of the first light-emitting device and the second light-emitting device includes:
      a first layer including a plurality of first quantum dots, and
      a second layer layered on the first layer and including a plurality of second quantum dots,
   the first layer in the second light-emitting device is non-light-emitting,
   the second layer in the first light-emitting device is non-light-emitting,
   a semiconductor conductivity type of the plurality of first quantum dots included in the first layer of the second light-emitting device is a p-type or an n-type, and
   a semiconductor conductivity type of the plurality of second quantum dots included in the second layer of the first light-emitting device is, from among the p-type and the n-type, different from the semiconductor conductivity type of the plurality of first quantum dots included in the first layer of the second light-emitting device.

2. The display device according to claim 1, wherein a material forming the first layer of the second light-emitting device and a material forming the second layer of the first light-emitting device contain any one of O, N, and Cl.

* * * * *